US008883047B2

(12) United States Patent
Ren et al.

(10) Patent No.: US 8,883,047 B2
(45) Date of Patent: Nov. 11, 2014

(54) THERMOELECTRIC SKUTTERUDITE COMPOSITIONS AND METHODS FOR PRODUCING THE SAME

(75) Inventors: Zhifeng Ren, Newton, MA (US); Jian Yang, Brookline, MA (US); Xiao Yan, Brighton, MA (US); Qinyu He, Guangzhou (CN); Gang Chen, Carlisle, MA (US); Qing Hao, Cambridge, MA (US)

(73) Assignees: Massachusetts Institute of Technology, Cambridge, MA (US); Trustees of Boston College, Chestnut Hill, MA (US)

( * ) Notice: Subject to any disclaimer, the term of this patent is extended or adjusted under 35 U.S.C. 154(b) by 906 days.

(21) Appl. No.: 12/990,268

(22) PCT Filed: Apr. 30, 2009

(86) PCT No.: PCT/US2009/042327
§ 371 (c)(1),
(2), (4) Date: Jan. 6, 2011

(87) PCT Pub. No.: WO2009/135013
PCT Pub. Date: Nov. 5, 2009

(65) Prior Publication Data
US 2011/0108778 A1    May 12, 2011

Related U.S. Application Data

(60) Provisional application No. 61/049,273, filed on Apr. 30, 2008, provisional application No. 61/049,609, filed on May 1, 2008.

(51) Int. Cl.
| | |
|---|---|
| *H01L 29/12* | (2006.01) |
| *H01B 1/02* | (2006.01) |
| *H01L 35/34* | (2006.01) |
| *H01L 35/12* | (2006.01) |
| *C22C 1/04* | (2006.01) |
| *B22F 1/00* | (2006.01) |
| *B22F 3/00* | (2006.01) |
| *C22C 1/00* | (2006.01) |
| *C22C 5/00* | (2006.01) |
| *B22F 9/00* | (2006.01) |
| *B22F 1/02* | (2006.01) |
| *C22C 1/05* | (2006.01) |
| *H01L 35/18* | (2006.01) |
| *B82Y 30/00* | (2011.01) |
| *C01G 49/00* | (2006.01) |
| *C01G 51/00* | (2006.01) |
| *C01G 53/00* | (2006.01) |
| *H01L 35/26* | (2006.01) |

(52) U.S. Cl.
CPC .............. *H01L 35/18* (2013.01); *B82Y 30/00* (2013.01); *C01G 49/009* (2013.01); *C01G 51/006* (2013.01); *C01G 53/006* (2013.01); *C22C 1/0433* (2013.01); *C22C 1/0466* (2013.01); *H01L 35/26* (2013.01); *B22F 2998/10* (2013.01); *B22F 2999/00* (2013.01); *C01P 2002/52* (2013.01); *C01P 2002/54* (2013.01); *C01P 2002/72* (2013.01); *C01P 2002/77* (2013.01); *C01P 2002/88* (2013.01); *C01P 2004/03* (2013.01); *C01P 2004/04* (2013.01); *C01P 2004/64* (2013.01); *C01P 2006/10* (2013.01); *C01P 2006/40* (2013.01); *Y10S 977/773* (2013.01)
USPC ............... 252/521.1; 252/521.2; 252/62.3 T; 977/773; 136/201; 136/236.1; 419/48; 75/228; 75/246; 75/255; 75/10.1

(58) Field of Classification Search
USPC ........................................................ 252/500
See application file for complete search history.

(56) References Cited

U.S. PATENT DOCUMENTS

| | | | | |
|---|---|---|---|---|
| 5,929,351 | A * | 7/1999 | Kusakabe et al. ................ | 75/228 |
| 5,994,639 | A | 11/1999 | Johnson et al. | |
| 6,207,886 | B1 * | 3/2001 | Kusakabe et al. ............. | 136/201 |
| 6,207,888 | B1 * | 3/2001 | Nolas ......................... | 136/236.1 |
| 7,465,871 | B2 | 12/2008 | Chen et al. | |
| 2002/0176815 | A1 * | 11/2002 | Fleurial et al. ................ | 423/263 |

(Continued)

FOREIGN PATENT DOCUMENTS

WO    2006106116 A2    10/2006

OTHER PUBLICATIONS

Bertini et al. Nanostructured Co1-xNixSb3 skutterudites: Synthesis, thermoelectric properties, and theoretical modeling. Journal of Applied Physics. vol. 93, No. 1. Jan. 2003.*
International Preliminary Report, dated Nov. 11, 2010, PCT/US2009/042327.
International Search Report and Written Opinion, dated Dec. 30, 2009, PCT/US2009/042327.

(Continued)

*Primary Examiner* — Harold Pyon
*Assistant Examiner* — Tanisha Diggs
(74) *Attorney, Agent, or Firm* — Nutter McClennen & Fish LLP

(57) ABSTRACT

Compositions related to skutterudite-based thermoelectric materials are disclosed. Such compositions can result in materials that have enhanced ZT values relative to one or more bulk materials from which the compositions are derived. Thermoelectric materials such as n-type and p-type skutterudites with high thermoelectric figures-of-merit can include materials with filler atoms and/or materials formed by compacting particles (e.g., nanoparticles) into a material with a plurality of grains each having a portion having a skutterudite-based structure. Methods of forming thermoelectric skutterudites, which can include the use of hot press processes to consolidate particles, are also disclosed. The particles to be consolidated can be derived from (e.g., grinded from), skutterudite-based bulk materials, elemental materials, other non-Skutterudite-based materials, or combinations of such materials.

21 Claims, 25 Drawing Sheets

(56) References Cited

U.S. PATENT DOCUMENTS

| | | | |
|---|---|---|---|
| 2006/0053969 A1* | 3/2006 | Harada et al. | 75/255 |
| 2006/0176815 A1 | 8/2006 | Picot et al. | |
| 2008/0202575 A1 | 8/2008 | Ren et al. | |
| 2009/0208364 A1* | 8/2009 | Berardan et al. | 420/581 |

OTHER PUBLICATIONS

Nolas et al., High figure of merit in partially filled ytterbium skutterudite materials. Applied Physics Letters. 2000, vol. 77, issue 12, pp. 1855-1857.

* cited by examiner

○ Co   ◯ Sb   ◯ Void

US 8,883,047 B2

THERMOELECTRIC SKUTTERUDITE COMPOSITIONS AND METHODS FOR PRODUCING THE SAME

CROSS REFERENCE TO RELATED APPLICATIONS

The present application claims the benefit of two U.S. provisional applications:
(i) U.S. Provisional Application Ser. No. 61/049,273, filed on Apr. 30, 2008, entitled "Thermoelectric Skutterudite Compositions;" and
(ii) U.S. Provisional Application Ser. No. 61/049,609, filed on May 1, 2008, entitled "Thermoelectric Skutterudite Compositions."
The present application is also related to U.S. Pat. No. 7,465,871, issued Dec. 16, 2008, entitled "Nanocomposites with High Thermoelectric Figures of Merit;" and a U.S. patent application bearing Ser. No. 11/949,353, filed Dec. 3, 2007, entitled "Methods for High Figure-of-Merit in Nanostructured Thermoelectric Materials." The contents of both provisional applications, the U.S. patent, and the U.S. utility application are hereby incorporated herein by reference in their entirety.

STATEMENT REGARDING FEDERALLY SPONSORED RESEARCH OR DEVELOPMENT

This invention was made with U.S. government support under Grant No. DG-FG02-00ER45805, awarded by the Department of Energy, Grant No. CBET-0506830, awarded by the NSF, and Grant No. NNC06GA48G, awarded by NASA. The U.S. government has certain rights in the invention.

TECHNICAL FIELD

The present application relates generally to thermoelectric materials and methods for their fabrication, and more particularly, to skutterudite-based thermoelectric materials that exhibit thermoelectric properties.

BACKGROUND OF THE APPLICATION

Thermoelectric materials can be utilized in a variety of industrial applications including high quality power generation devices and cooling devices. They can also be used in solar conversion and extraction of automotive or industrial waste heat. The thermoelectric properties of any material can be characterized by a quantity called figure of merit Z (or dimensionless figure of merit ZT), defined as $Z=S^2\sigma/k$, where S is Seebeck coefficient, $\sigma$ is electrical conductivity, and k is total thermal conductivity. It is desirable to construct materials with high ZT values (e.g., having low thermal conductivity k and/or high power factor $S^2\sigma$). Accordingly, researchers continue to seek to produce materials that exhibit superior ZT values.

Skutterudites are a potentially attractive class of substances that might be used in producing thermoelectric materials. They typically exhibit outstanding electrical properties, including high electrical charge mobilities and substantial Seebeck coefficients—which can result in high power factors. Unfortunately, they also often exhibit high thermal conductivities, which can limit the overall ZT value that can be achieved by a thermoelectric material.

Accordingly, the need persists to develop thermoelectric materials that exhibit attractive performance properties, including materials that may be related to skutterudites.

SUMMARY

Some embodiments of the present invention are directed to methods of fabricating an enhanced thermoelectric material. Such materials can exhibit good ZT values (e.g., greater than about 0.8), which can occur at one or more selected temperatures (e.g., at a temperature below about 800° C.). A plurality of nanoparticles can be generated from one or more starting materials. The starting material(s) can be one or more elements, and/or include one or more skutterudite-based starting materials (e.g., two or more skutterudite-based starting materials). When the latter are used, the densified material can exhibit a higher ZT value at least at one temperature relative to at least one of the skutterudite-based starting materials. The starting material can optionally include one or more types of filler atoms, which can be used in the skutterudite-based structure. Such nanoparticles can be consolidated under pressure and an elevated temperature to form a densified material. The densified material can include a plurality of grains, in which each grain can exhibit a skutterudite-based structure. The skutterudite-based structure, which can be filler-containing, can include a crystal having metal atoms (e.g., having one, two, or more of cobalt, iron, nickel, rhodium, iridium, ruthenium, and osmium) forming a cubic sublattice. The grains can exhibit an average size smaller than about 5 microns, and optionally larger than the average size of the nanoparticles from which the densified material was formed.

Generation of nanoparticles can be performed using any number of methodologies. In some embodiments, generation of nanoparticles can include grinding (e.g., ball milling) at least one starting material to form the nanoparticles. When multiple starting materials are utilized, the materials can be combined together in any combination and ground, or ground separately to a final disposition for consolidation, or separately ground and then mixed together and ground further to a disposition for consolidation. Materials being grinded can also be cooled, which can promote particle formation in some instances. The average size of the generated nanoparticles can be smaller than about 50 nm.

Consolidation of nanoparticles can also be performed using any number of techniques. In some embodiments, consolidation is performed using a hot press process (e.g., using at least one of direct current induced hot press, unidirectional hot press, plasma pressure compaction, and isostatic hot press). The consolidation can occur at a pressure in a range from about 10 MPa to about 900 MPa; and/or using a temperature in a range from about 200° C. to about 800° C. The time period to which the nanoparticles are subjected to a pressure and elevated temperature can be between about 1 sec and about 10 hours.

Other embodiments of the present invention are directed to thermoelectric materials, which can include a plurality of compacted crystalline skutterudite-based grains. Such thermoelectric materials can exhibit a ZT value greater than about 0.5, 0.8, or 1. The crystalline skutterudite-based grains can include crystallites having metal atoms (e.g., having one, two, or more of cobalt, iron, nickel, rhodium, iridium, ruthenium, and osmium) forming a cubic sublattice. Group VA atoms can be included, which can form a plurality of planar rings within the cubic sublattice. Filler atoms can also, optionally, be added, where filler atoms can include at least one a rare earth element and a Group IIA element. The grains can exhibit an average size of less than about 5000 nm or 1000 nm.

Other embodiments of the present invention are directed to thermoelectric materials, which can include a skutterudite-based structure. The structure can include grains each exhibiting a unit cell formed from (i) at least one Group VA element, and (ii) at least one of cobalt, iron, nickel, rhodium, iridium, ruthenium, and osmium. The grains can exhibit an average size of less than about 5000 nm or less than about 1000 nm. The structure can also include at least one type of filler atom in each unit cell, such as a rare earth element and/or a Group IIA element. In some instances the at least one filler atom comprises at least one, or at least two, of cerium, neodymium, lanthanum, barium, and ytterbium. In some instances, the structure can be characterized by an enhanced ZT value relative to a bulk material having the skutterudite-based structure. For example, the thermoelectric material can exhibit a ZT value greater than about 0.8 or about 1.0; the ZT value can optionally be exhibited at a temperature below about 600° C.

Thermoelectric materials, consistent with embodiments of the invention, can include at least one of a n-type material and a p-type material. In some instances, the thermoelectric material is a p-type material. The p-type material can include a composition consistent with the formula $$ReFe_{4-y}M_ySb_{-12}$$

where Re is at least one of a rare earth element and a Group IIA element (e.g., barium), M is cobalt or nickel or combinations of them with other elements, and y is zero or a positive number no greater than 4. For instance, the p-type material can include a composition consistent with the formula $ReFe_{3.5}Co_{0.5}Sb_{-12}$, where Re is any one of neodymium, cerium, lanthanum, or ytterbium.

In other instances, the thermoelectric material is a n-type material. The n-type material can include a composition consistent with the formula $$Re_zM_yCo_{4-y}Sb_{-12}$$

where Re is at least one of a rare earth element and a Group IIA element, M is a metal, y is zero or a positive number no greater than 4; and z is a positive number no greater than 1. For example, the thermoelectric material can include a composition consistent with a formula: $Re_zCo_{-4}Sb_{-12}$, where z is a number between about 0.2 and about 1, and Re is at least one of cerium, neodymium, lanthanum, barium, and ytterbium. In another example, the thermoelectric material comprises a n-type composition consistent with a formula: $Re1_{Z1}Re2_{Z2}Co_{-4}Sb_{-12}$, where Z1 and Z2 are each independently a number between about 0.2 and about 1 with a sum of Z1 and Z2 not greater than about 1, and Re1 and Ret are each independently at least one of cerium, neodymium, lanthanum, barium, and ytterbium. In yet another example, the thermoelectric material comprises a composition consistent with a formula: $Yb_zM_yCo_{4-y}Sb_{12}$, where z is any number between about 0.2 and about 1, and y is optionally zero.

Additional embodiments of the invention are drawn toward thermoelectric materials that can include a filler enhanced skutterudite material comprising at least one type of filler, which can be distributed throughout the thermoelectric material. The filler enhanced skutterudite material can exhibit a higher fractional amount of the at least one type of filler relative to a maximum achievable equilibrium fractional amount of the at least one type of filler in a bulk form of the filler enhanced skutterudite-based material. For instance, the materials can include a composition consistent with the formula $Yb_zCo_4Sb_{12}$, where z is any number between about 0.2 and about 1, or between about 0.3 and about 0.5 (e.g., 0.3, 0.4, or 0.5).

BRIEF DESCRIPTION OF THE FIGURES

FIG. 2b presents a transmission electron micrograph at higher magnification that the image of FIG. 2a within the circular region shown in FIG. 2a;

FIG. 7b presents graphs of the measured Seebeck coefficient as a function of temperature for the hot pressed samples in FIG. 7a;

FIG. 7c presents graphs of the measured thermal conductivity as a function of temperature for the hot pressed samples in FIG. 7a;

FIG. 7d presents graphs of ZT values as a function of temperature for the hot pressed samples in FIG. 7a;

FIG. 8b presents graphs of the measured Seebeck coefficient as a function of temperature for the hot pressed samples in FIG. 8a;

FIG. 8c presents graphs of the calculated power factor as a function of temperature for the hot pressed samples in FIG. 8a;

FIG. 8d presents graphs of the measured thermal conductivity as a function of temperature for the hot pressed samples in FIG. 8a;

FIG. 8e presents graphs of the lattice thermal conductivity as a function of temperature for the hot pressed samples in FIG. 8a;

FIG. 8f presents graphs of ZT values as a function of temperature for the hot pressed samples in FIG. 8a;

FIG. 9b presents graphs of the measured Seebeck coefficient as a function of temperature for the hot pressed samples in FIG. 9a;

FIG. 9c presents graphs of the calculated power factor as a function of temperature for the hot pressed samples in FIG. 9a;

FIG. 9d presents graphs of the measured thermal conductivity as a function of temperature for the hot pressed samples in FIG. 9a;

FIG. 9e presents graphs of the lattice thermal conductivity as a function of temperature for the hot pressed samples in FIG. 8a;

FIG. 9f presents graphs of ZT values as a function of temperature for the hot pressed samples in FIG. 8a;

FIG. 11b presents a transmission electron microscopy image of the sample in FIG. 11a;

FIG. 12b presents graphed data of measured Seebeck coefficient as a function of temperature for the samples in FIG. 12a;

FIG. 12c presents graphed data of calculated values of the product of the power factor with temperature as a function of temperature for the samples in FIG. 12a;

FIG. 12d presents graphed data of measured thermal conductivity as a function of temperature for the samples in FIG. 12a;

FIG. 12e presents graphed data of ZT values as a function of temperature for the samples in FIG. 12a;

FIG. 13b presents graphed data of measured Seebeck coefficient as a function of temperature for the samples in FIG. 13a;

FIG. 13c presents graphed data of calculated values of the product of the power factor with temperature as a function of temperature for the samples in FIG. 13a;

FIG. 13d presents graphed data of measured thermal conductivity as a function of temperature for the samples in FIG. 13a;

FIG. 13e presents graphed data of ZT values as a function of temperature for the samples in FIG. 13a;

FIG. 14b presents graphed data of measured Seebeck coefficient as a function of temperature for the samples in FIG. 14a;

FIG. 14c presents graphed data of calculated values of the product of the power factor with temperature as a function of temperature for the samples in FIG. 14a;

FIG. 14d presents graphed data of measured thermal conductivity as a function of temperature for the samples in FIG. 14a;

FIG. 14e presents graphed data of ZT values as a function of temperature for the samples in FIG. 14a;

FIG. 15b presents graphed data of measured Seebeck coefficient as a function of temperature for the samples in FIG. 15a;

FIG. 15c presents graphed data of calculated values of the product of the power factor with temperature as a function of temperature for the samples in FIG. 15a;

FIG. 15d presents graphed data of measured thermal conductivity as a function of temperature for the samples in FIG. 15a; and FIG. 15e presents graphed data of ZT values as a function of temperature for the samples in FIG. 15a.

DETAILED DESCRIPTION

Some embodiments of the present invention are directed to novel compositions and/or methods relating to skutterudite-based thermoelectric materials. Such embodiments can result in improved ZT values such as by modifications that can lower the thermal conductivity of a final thermoelectric material relative to the one or more starting materials from which the final product is made. Improvements in thermoelectric performance can be made in any number of manners described herein, including the use of a final structure with a plurality of grains, and/or incorporation of one or more filler atoms into a unit cell of a skutterudite based crystal, among other modifications which include using more than one of the modifications. These embodiments, among others, are described within the present application.

Skutterudite-Based Compositions

Figure 1:
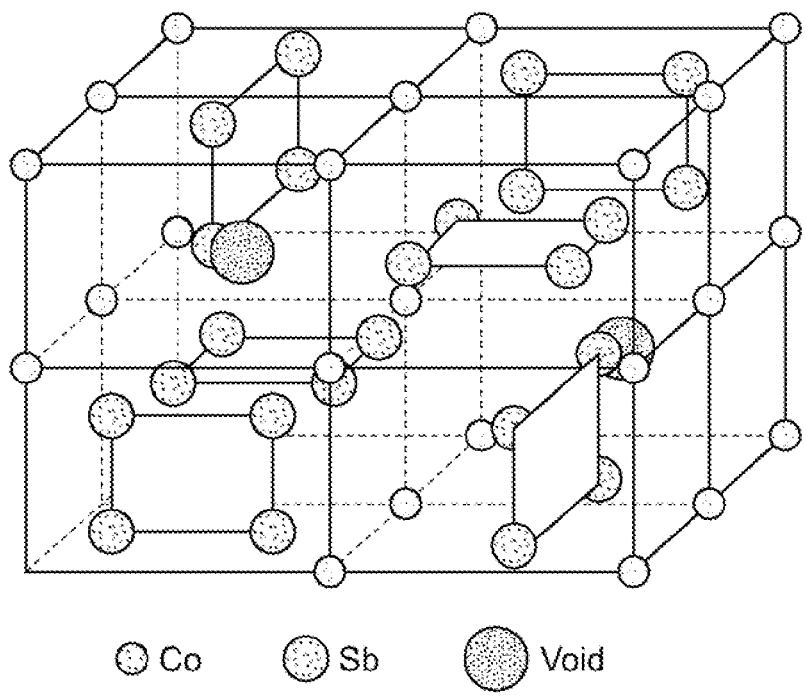
FIG. 1 presents a perspective schematic diagram of a $CoSb_3$ skutterudite crystal structure, consistent with some embodiments of the present invention.

Skutterudites are compositions whose principal constituents are typically cobalt or iron, and a Group VA element such as phosphorus, arsenic, antimony or bismuth. One example would be a cobalt and antimony containing composition. An example of the unit cell structure of a $Co_4Sb_{12}$ skutterudite is shown in FIG. 1; in FIG. 1 the unit cell is shifted by one quarter distance along the body diagonal. The cobalt atoms are generally arranged in a cubic crystalline structure, forming a cubic sublattice of 8 cubes. The atoms of the Group VA element form a secondary crystalline structure within the cobalt cubic unit cell, forming planar rings such as the four-membered rings shown in FIG. 1.

Skutterudite-based materials can generally include materials having portions that conform to the structure of one or more skutterudite crystals (e.g., consistent with FIG. 1). The crystal(s), however, can include modifications. For example, the cobalt atoms of FIG. 1 can be replaced, or supplemented, by one or more types of metal atoms, which can include iron, nickel, rhodium, iridium, ruthenium, and osmium. Mixed metal atom constituents in a unit cell can include various appropriate combination of metals; nickel/cobalt or cobalt/ iron compositions, which are commonly found in natural depositions, are examples of such combinations. The Group VA atoms that can be used can include one or more of phosphorous, arsenic, antimony, and bismuth—which can optionally include mixtures thereof.

In some embodiments, one or more types of filler atoms can be included in a skutterudite-based material. Types of filler atoms can include any atomic type suitable for inclusion in a skutterudite-based material (e.g., those that can enhance the ZT value of a material). In some embodiments, the filler atom can include one or more of a rare earth metal and a Group IIA element (e.g., barium). Non-limiting examples of such fillers include cerium, neodymium, lanthanum, barium, and ytterbium.

Without necessarily being bound by any particular theory, it is believed that a filler atom can be located in a void of a crystal unit cell, as shown in FIG. 1. The presence of a filler atom can act as a defect and/or as a void filler, which can potentially depress the thermal conductivity of the material relative to not using a filler atom. For instance, it is conjectured that a filler atom lowers the thermal conductivity of the material because of the dynamics, or rattling, caused by the disorder introduced by a filler atom in the void; loosely bound rattlers can produce local vibrations of lower frequency, and are thus more effective in scattering the lower frequency, heat carrying phonons.

The amount of a filler atom(s) to be incorporated into a skutterudite-based material can be any to allow the formation of a thermoelectric material with desired properties. Other properties can also be selected to limit the amount of one or more filler atoms. For instance, the amount of a filler can be chosen to be no greater than to allow a single phase material to be formed and/or a single type of crystalline structure to predominate the overall material's structure.

As an example of a skutterudite-based material, a thermoelectric material can include one or more portions having a stoichiometry consistent with the following formula:

$$Re_zCo_{4-x}M_xSb_{12-y}Ch_y,$$

where x has a value in a range from 0 to 4, which includes the possibilities of x=0 and x=4; y has a value in a range from 0 to 12, which includes the possibilities of y=0 and y=12; z has a value of zero or a positive number no greater than about 2 (e.g., about 1, 0.9, 0.8, 0.7, 0.6, or 0.5); Re is a filling atom; M is a transitional metal required by charge compensation; and Ch is a Group VA atom such as antimony or an atom in close proximity to antimony such as tellurium.

It is also understood that more than one type of filler atom can be used in describing the stoichiometry of the unit cell of a skutterudite-based material. For example, a skutterudite-based material can include one or more portions having a stoichiometry consistent with the following formula:

$$Re1_wRe2_xFe_yCo_{4-y}Sb_{12}$$

where w and x each have positive values greater than or equal to zero, optionally their sum is less than about a selected value (e.g., 2 or 1); y has a positive value no greater than 4; Re1 is one type of filler atom (e.g., a rare earth atom); and Re2 is another type of filler atom different than Re1, which can be another rare earth atom or a Group IIA atom (e.g., barium). Of course, other Group VA atoms can be substituted for antimony, and other variations of a skutterudite-based material having multiple types of filler atoms and/or metal atoms forming the cubic sublattice are also possible.

Skutterudite-based materials can also include dopants, which can affect the properties of the material. For instance, the nanoparticles can be compactified with other types of particles such as particles from a source material having a good ZT value (e.g., greater than about 0.5), and/or micron-sized particles (e.g., particles having an average size from about 1 micron to about 10, 50, 100, or 500 microns).

Other embodiments of the invention can include n-type and p-type skutterudite-based materials. In some instances, these materials can exhibit enhanced thermoelectric figures-of-merit (e.g., greater than 1). Such materials can be advantageously utilized as semiconductor materials, for example as incorporated into a portion of a solar energy device.

In some illustrative embodiments, a skutterudite-based material can include a n-type material having a composition consistent with the following general formula:

$$Re_zM_yCa_{4-y}Sb_{12}$$

where Re is a rare earth element (e.g., lanthanum, cerium, ytterbium, neodymium, or combinations thereof) or a Group IIA element (e.g., barium, calcium, etc., or combinations thereof); M is a metal (e.g., iron, nickel, or others); y is zero or a positive number no larger than 4; and z is a value greater than zero. In some instances, z is no greater than about 1. In some instances, z has a value greater than about 0.2 or greater than about 0.3. As well, z can also have an upper limit no greater than about 0.5 in some instances. In some embodiments, these potential values of z can be applied when y is substantially zero. In particular embodiments, Re is any one of lanthanum, ytterbium, and neodymium, or Re is ytterbium. In other embodiments, two or more types of filler atoms can be used, for example:

$$Re1_{z1}Re2_{z2}M_yCo_{4-y}Sb_{12}$$

where z1 and z2 each have positive values such that the sum of z1 and z2 is no greater than about 1 or about 0.5. In some instances, y can be about 2. In some instances using multiple types of filler atoms, one type of atom is ytterbium, and optionally another type is barium.

In other embodiments, a skutterudite material can include a p-type skutterudites can have material having a composition consistent with the following general formula:

$$Re_zFe_{4-x}M_xSb_{12}$$

where Re is a rare earth element (e.g., lanthanum, cerium, ytterbium, or neodymium or combinations thereof) or a Group IIA element (e.g., barium, etc.); M is cobalt or nickel or combinations of them with other elements; x is 0 or a positive number no greater than 4; and z is any positive number less than 1 (including zero). For instance, in some embodiments, z is in a range from about 0.05 to about 1, and x is about 0.5; in a particular embodiment, Re is neodymium. As well, multiple types of filler atoms can be utilized, for example materials having a stoichiometry consistent with:

$$Re1_{z1}Re2_{z2}Fe_{4-x}M_xSb_{12}$$

where z1 and z2 each have positive values such that the sum of z1 and z2 is no greater than about 1.

While thermoelectric materials can utilize skutterudite-based compositions with stoichiometries as disclosed herein, in some embodiments the materials are formed from a plurality of grains. Such grains can each include at least a portion that has a skutterudite-based structure. The skutterudite-based structure can be of any stoichiometry consistent with skutterudite-based materials including those explicitly disclosed herein. Any of these grains can be formed by a plurality of mechanisms including, but not limited to, consolidation of particles (e.g., as described herein) and/or formation by solid-state chemical reaction.

Grains of a thermoelectric material can have a variety of characteristics. In some embodiments, each grain has a crystalline structure. In such an instance, the thermoelectric material can comprise a polycrystalline-like structure in which the grains generally lack a preferred orientation (e.g., randomly oriented). In some instances, the grains can also exhibit some type of preferred orientation due to grain shapes, where the general crystalline direction of the grains can either be random or exhibit some preferred direction relative to one another.

In general, thermoelectric materials consistent with embodiments of the invention can include a variety of sizes of grains. For example, the thermoelectric material can have some grains larger than 1 μm and some grains smaller than 1 μm. In some embodiments, the thermoelectric material exhibits an average grain size that is smaller than about a designated size (e.g., 5 microns). Non-limiting examples include about 5000 nm, 3000 nm, 1000 nm, 900 nm, 800 nm, 700 nm, 600 nm, 500 nm, 400 nm, 300 nm, 200 nm, 100 nm, 50 nm, or 10 nm. In some cases, the average grain size can be determined using a variety of methodologies, including methods understood by those skilled in the art. For example, transmission electron micrographs (herein "TEMs") can be used to image the grains whose sizes can then be determined and averaged. Since grains are typically irregularly shaped, the measured size of a grain can be determined using any number of techniques, including ones known to the skilled artisan. For example, the largest dimension of the grain can be used from an image (e.g., a scanning electron micrograph image and/or TEM image), or an effective diameter can be calculated based on surface area measurements or the effective-cross sectional area of grains from an image.

Without necessarily being bound by any particular theory, it is believed that the properties (e.g., ZT value at a given temperature) of thermoelectric materials having skutterudite-based grains can be the result of variations in combination of the thermal conductivity, the Seebeck coefficient, and the electrical conductivity. Thermal conductivity has two contributions: lattice and charge carrier contributions. In single crystals or polycrystalline samples with large grains, lattice thermal conductivity is fixed for a specific material. However, if the material is composed of nanosized grains, the lattice part of thermal conductivity can drop due to interface scattering of phonons. Such a decrease in phonon scattering reduces the thermal conductivity to a greater extent relative to the decrease in electrical conductivity, leading to a greater ZT value. Also, the Seebeck coefficient can increase because of the carrier filtering effect (usually low energy electrons/holes are scattered thereby increasing Seebeck coefficient). The electronic contribution to thermal conductivity can potentially be reduced by interfacial barrier scattering of electrons, especially the bi-polar contribution to thermal conductivity since the barrier can preferentially scatter one-type of charge (electrons or holes) without substantially affecting another type of carrier. Additionally, quantum size effects can further affect the Seebeck coefficient and electrical conductivity so that $S^2\sigma$ increases.

Thermoelectric materials exhibiting a plurality of grains with skutterudite-based structure can be manufactured using any number of techniques, including those described herein and/or those understood by one skilled in the art. For instance, a plurality of particles (e.g., nanosized particles) can be obtained from one or more starting materials, which can include skutterudite-based bulk materials, elemental materials and/or other non-skutterudite-based materials, or combinations thereof. The phrase "bulk material" refers to an equilibrium stoichiometry typically achieved in a bulk material at a given pressure and temperature. In some instances, the bulk material can also imply a material having a single thermodynamic phase (i.e., during formation of the material, different phases do not form). The particles can be consolidated (e.g., compactified under pressure and/or elevated temperature) to form a plurality of grains, which can be physically distinct from the starting particles (e.g., average grain size larger than the average starting particle size, a different crystalline phase). As well, or in addition, the materials can be chemically distinct relative to the starting particles or starting materials. For instance, particles can be formed from elemental materials or other non-skutterudite materials such as a combination that has an overall stoichiometry similar to a final skutterudite-based structure. The final skutterudite-based structure can be exhibited in the consolidated thermoelectric material.

In some embodiments, consolidation of one or more starting materials can result in the formation of a thermoelectric material where the amount of one or more types of filler atoms in a skutterudite-based structure exceeds the maximum achievable equilibrium amount typically formed in a bulk form of the skutterudite-based material with the filler atom(s) (e.g., the bulk form can be a form with substantially one thermodynamic phase). For instance, the maximum achievable equilibrium amount of a filler atom in a skutterudite-based can be the amount of filler atom such that if the ratio of filler atom were any higher relative to the other components, upon forming a solid material from another state, the solid material would have a plurality of equilibrium phases.

As a specific example, with reference to the n-type skutterudites previously discussed, a material having the structure $Yb_zCo_4Sb_{12}$ can exhibit a stoichiometry where the value of z exceeds the highest value found in a bulk material preparation. Accordingly, z can have a value greater than 0.2 or greater than 0.3. As well, the amount of filler can be limited such that the consolidated material substantially forms one phase or a designated number of phases. With respect to the example discussed above, for instance, z can have a value less than about 0.5 (e.g., z can have a value no less than about 0.1 or 0.3, and no greater than about 0.5). While some of these embodiments are discussed with respect to this particular example, it is understood that such embodiments are not necessarily limited to the parameters of the specific example here. As well, other methods of forming skutterudite-based materials that have higher than bulk properties of filler atom(s) loading can also be utilized consistent with the present application.

In general, the ZT value of a thermoelectric material of the present application (e.g., a material formed consistent with any of the compositions herein or using any of the methods herein) can take on a variety of values (e.g., have a value greater than about 0.5). In some embodiments, the ZT values of the formed material can be greater than about 0.8, 0.9, 1, 1.1, 1.2, 1.3, 1.4, 1.5, 1.6, 1.7, 1.8, 1.9, or 2. In some embodiments, the thermoelectric material can exhibit a ZT value in a range whose lower limit is one of the above ZT values and whose upper limit reaches to a value of about 4, 5, or 6.

In some embodiments, the peak ZT value or average ZT value of the material relative to a temperature range, can be greater than the peak ZT value or the average ZT value of one or more starting materials from which the thermoelectric material is formed. For instance, when one or more starting materials are used as a source of particles that are consolidated (e.g., compactified under pressure and elevated temperature) to form a thermoelectric material, the final product can exhibit a ZT value greater than at least one of the starting materials such as a skutterudite-based starting materials and/ or an elemental starting material. In other embodiments, a ZT value of the thermoelectric material can be greater than a ZT value of a bulk material having a composition equivalent to a portion, or the entirety, of the plurality of particles that are consolidated to form the thermoelectric material.

While these ZT values can be identified without a limitation in temperature, in some embodiments the thermoelectric materials can exhibit a designated ZT value at a particular temperature or within a temperature range. For instance, the thermoelectric material can exhibit an elevated ZT value (e.g., maximum ZT value or average ZT value over a temperature range) relative to one or more of the starting materials at a temperature below about 800° C., below about 700° C., below about 600° C., below about 500° C., below about 400° C., below about 300° C., or below about 200° C. In some embodiments, the temperature range in which an elevated ZT value is exhibited can depend upon the composition of a thermoelectric material.

Methods of Forming Thermoelectric Materials

Some embodiments of the present invention are directed to forming a thermoelectric material that includes a plurality of crystals exhibiting a skutterudite-based structure. The methods can be used to form some of the thermoelectric compositions described herein, among others. In general, a plurality of nanoparticles can be formed from one or more starting materials. The nanoparticles can be consolidated, such as to form a densified material comprising a plurality of crystals/grains where each exhibits a skutterudite-based structure. The consolidation can occur under pressure and/or elevated temperature, which can act to change the physical and/or chemical nature of the nanoparticles (e.g., compactifying the particles and causing crystal/grain growth of the final densified material). Thermoelectric materials having these properties can exhibit enhanced properties (e.g., ZT values) consistent with what has been discussed herein. For instance, the formed thermoelectric material can exhibit an average grain/crystal size that is larger than the average particle size. In another example, the average starting particle size can be smaller than about 50 nm, and/or the average grain size of the thermoelectric material can be smaller than about 5 μm.

In general, a densified material exhibits a low porosity (e.g., the actual density of the end-product can approach or be equal to the theoretical density of the composition, for instance a bulk starting material used to make nanoparticles in some embodiments), which can aid in obtaining an elevated ZT value. Porosity is defined as the difference between the theoretical density and the actual density of the material divided by the theoretical density. In general, the phrase "theoretical density" is known to those skilled in the art. The porosity in the material can be less than about 10%, 5%, or 4%, or 3%, or 2%, or 1%, or 0.5%, or 0.1%. In some embodiments, a thermoelectric material exhibits a density approaching 100% of a theoretical density. In some embodiments, the density of a thermoelectric material can be between 100% and 90%, 95%, 96%, 97%, 98%, 99%, 99.5%, or 99.9% of a respective theoretical density. Without necessarily being bound by theory, it is believed that densification can help maintain contact between grains, which can help maintain the electrical conductivity of the material.

The skutterudite-based structure of the product formed by these methods can be consistent with any skutterudite-based material including any of those described in the present application. Techniques for forming nanoparticles and consolidating the nanoparticles include those described in U.S. Patent Application Publication No.: US 2008/0202575 A1, entitled "Methods for High Figure-of-Merit in Nanostructured Thermoelectric Materials," filed on Dec. 3, 2007, and incorporated herein by reference in its entirety.

The term "nanoparticle," synonymous with the phrase "nanosized particle," is generally known in the art, and is used herein to refer to a material particle having a size (e.g., an average or a maximum size) less than about 1 micron such as in a range from about 1 nm to about 1000 nm. Preferably the size can be less than about 500 nm, less than about 200 nm, or less than about 100 nm, preferably in a range of about 1 to about 200 nm, and more preferably in a range of about 1 to about 100 nm.

The nanoparticles can be generated, for instance, by breaking up one or more starting material into nano-sized pieces (e.g., grinding using any of dry milling, wet milling, or other suitable techniques). Grinding can be performed using a mill, such as a ball mill using planetary motion, a figure-eight-like motion, or any other motion. When generating nanoparticles, some techniques, such as some grinding techniques, produce substantial heat, which may affect the nanoparticle sizes and properties (e.g., resulting in particle agglomeration). Thus, in some embodiments, cooling of a thermoelectric material can be performed while grinding the material. Such cooling may make a thermoelectric material more brittle, and ease the creation of nanoparticles. Cooling and particle generation can be achieved by wet milling and/or cryomilling (e.g., in the presence of dry-ice or liquid nitrogen surrounding the mill).

The milling time can be any time appropriate to achieve a desired character of the plurality of particles (e.g., average particle size). Accordingly, the milling time can range from about 0.1 hours to about 100 hours. In some embodiments, ball milling can be performed for a time less than about 50 hours, 40 hours, 30 hours, 20 hours, or 10 hours. The balling milling can also be performed for a minimum amount of time, e.g., greater than about 1 hour, 5 hours, or 10 hours.

Some other methods of generating the nanoparticles can include gas phase condensation, laser ablation, chemical synthesis (e.g., wet or dry methods), rapid cooling of sprays, spinning molten materials at high speed, and other methods of forming nanoparticles. Accordingly, the scope of the present application is not limited to the specific particle production methodologies discussed herein. It is understood that particle generation techniques can be combined in any fashion to create materials for consolidation. For example, some particles can be generated by ball milling (e.g., to create a host material), while other particles can be generated by one or more other techniques (e.g., gas phase condensation, laser ablation, etc.).

The starting material(s) from which nanoparticles are generated can include a large variety of materials including bulk materials, elemental materials, alloys, and other materials. In general, the starting materials are chosen and combined in a quantity to allow the formation of a skutterudite-based structure in at least a portion of the finally formed material. In some embodiments, the starting material can include one or more types of skutterudite-based materials, which can optionally be in bulk form. These starting skutterudite-based materials can have the same structure as the finally formed thermoelectric material, or can be somewhat different. As well, particles can be generated from more than one type of skutterudite-based material to form particles of a plurality of types.

Other potential starting materials can include non-skutterudite-based materials. Such materials can include bulk materials such as elemental materials that can be grinded to form the plurality of nanoparticles. In some instances, the grinded elemental materials can be combined in any workable proportion, e.g., a proportion to form one or more desired stoichiometries of a final skutterudite-based structure. For instance, elemental materials from metals (e.g., at least one or two of cobalt, iron, nickel, rhodium, iridium, ruthenium, and osmium), Group VA materials (e.g., at least one or two types of Group VA elements), and optionally filler atoms (e.g., at least one of a rare earth element and Group IIA element) can be used to generate particles for consolidation. One particular example includes antimony, cobalt, and one or more filler atom types. The particles can be formed separately and combined before consolidation, or the starting materials can be combined to generate the plurality of particle types in situ. In the former, initially separate particles formed can be combined and further grinded (e.g., ball milled) to form a uniform mixture or "mechanically alloyed" particles, which can result in further reduction of particle size. Of course, other types of non-skutterudite-based materials can also be used as starting materials. It is also understood that any plurality of the types of starting materials discussed can also be utilized to form particles (e.g., one or more skutterudite-based bulk materials and one or more types of elemental materials).

In general, starting materials can be specifically prepared, or commercially available materials. Though many bulk starting materials are solids that can be broken apart to generate particles, bulk starting materials can also be generated from other thermodynamic states such as gases, when generating particles from gas phase condensation, or liquids, when generating particles from wet chemical methods. It is also understood that the particles can be generated from a mixture of materials having different thermodynamic phases (e.g., a mixture of liquid and gas).

Consolidation of the nanoparticles under pressure and elevated temperature can be performed in a variety of manners, under a variety of conditions. Processes such as hot press can be employed to impose the desired pressure and temperature during consolidation. Examples of hot press processes include unidirectional hot press, direct current induced hot press (DC hot press), plasma pressure compaction ($P^2C$) or spark plasma sintering (SPS), and isostatic hot press. A description of the DC hot press or $P^2C$ process, and an apparatus for carrying out this process, is available in U.S. Patent Application Publication No. US 2006/0102224, bearing Ser. No. 10/977,363, filed Oct. 29, 2004; which is incorporated by reference in its entirety herein.

The pressures utilized typically exceed one atmosphere, which allow for the use of lower temperatures to achieve consolidation of the nanoparticles. In general, the pressures utilized can range from about 10 MPa to about 900 MPa. In some embodiments, the pressure ranges from about 10 MPa to about 600 MPa. In other embodiments, the pressure ranges from about 10 MPa to about 300 MPa. In still other embodiments, the pressure ranges from about 10 MPa to about 100 MPa.

The selected temperature for consolidation can be, for example, in a range between about 200° C. to about the melting point of the thermoelectric material or starting material (e.g., 200° C. to about 800° C.), or in a range of about 200° C., 400° C., or 500° C. to about 800° C.

The period of time to which particles are subjected to a given pressure and elevated temperature can be any sufficient to cause formation of a thermoelectric material exhibiting one or more of the properties disclosed herein. For example, the period of time can be in a range of about 1 second to about 10 hours, or of about 1 minute to about 5 hours, or of about 2 minutes to about 60 minutes, so as to generate a resultant thermoelectric material with enhanced thermoelectric properties. In other embodiments, the nanoparticles are subjected to a selected temperature while being held at low or ambient pressure for a time sufficient to allow the resultant thermo-electric material to be formed, or annealed either before or after pressurization. In further embodiments, nanoparticles can be consolidated under high pressure at room temperature to form a sample with high theoretical density (e.g., about 100%), and then annealed at high temperature to form the final thermoelectric material. As well, a sample can be subjected to multiple states of pressure and temperature to perform consolidation.

Other consolidation techniques can also be utilized to form the thermoelectric materials described in the present application. For example, nanoparticles can be impacted at high speed against other particles to achieve low temperature compaction. Subsequent heat treatment can optionally be utilized to form the thermoelectric material. Other consolidation processes can utilize annealing of particles (e.g., nanoparticles) using little or no pressure to consolidate the particles. In such instances, the temperature can be selected to induce annealing of particles at whatever pressure the sample is held at during annealing. In other instances, particles can be consolidated at high pressure at a relatively low temperature to form a consolidated material, such as a material with close to 100% theoretical density. The consolidated material can be subsequently annealed at an elevated temperature to form the thermoelectric material. Accordingly, consolidation techniques need not be restricted to hot press methods.

Other embodiments directed to forming thermoelectric materials utilize one or more repetitions of steps discussed herein to form thermoelectrics as discussed herein. For example, particles (e.g., nanoparticles) can be generated from one or more starting materials (e.g., skutterudite-containing starting materials or elemental materials) and consolidated into a material structure. The resulting structure can then be used to generate a new plurality of particles (e.g., by grinding the material structure), which can be subsequently consolidated to form another material structure. This process can be repeated any number of times to form an end-thermoelectric material. Such a process can aid in generating small grain sizes that are thoroughly mixed.

EXPERIMENTAL RESULTS

The following experimental section is provided for further illustration of various aspects of the invention and for illustrating the feasibility of utilizing the methods of the invention for generating thermoelectric materials exhibiting enhanced thermoelectric properties. It should, however, be understood that the following examples are provided only for illustrative purposes and are not necessarily indicative of optimal results achievable by practicing the methods of the invention.

Experimental Set 1

N-Type $Co_4Sb_{12}$-Based Skutterudites Doped with Ytterbium

Samples of $Co_4Sb_{12}$-based n-type materials were prepared and tested having various amounts of ytterbium. The stoichiometry of the prepared samples followed the formula $Yb_xCo_4Sb_{12}$, where x=0.3, 0.35, 0.4, 0.5, or 1.0 for the samples.

Pure elements of Co (99.8%, Alfa Aesar), Sb (99.999%, Chengdu Chemphys Chemical Industry, China), and Yb (99.9%, Alfa Aesar) were mixed according to the desired stoichiometries. For each sample, the elements, at the appropriate relative amounts, were loaded into a stainless steel jar with stainless steel balls, and ball milled for 10 to 15 hours using a Spex high energy ball milling machine. The ball-milled nanopowder was pressed into pellets using the DC hot press method at temperatures of 600-700° C., i.e., 600° C. for about 5 minutes followed by 700° C. for about 2 minutes, in a graphite die under a force of about 1 to 1.5 tons. After cooling to room temperature, the DC hot pressed pellets were ejected out of the graphite die, cut into disks or bars, and polished for thermoelectric property characterization.

A number of analytical techniques were used to investigate the samples. X-ray diffraction (D8, Bruker) analysis at a wavelength of 0.154 nm was also performed on the ball milled powders and the pressed pellets to determine the constituent phases of powders and pellets. The freshly fractured surface of $Yb_xCo_4Sb_{12}$ consolidated samples were investigated by scanning electron microscopy (JEOL 6340F) to determine the grain sizes and chemical compositions. Cross-sectional samples were also prepared to study the grain sizes and crystalline structure using a high resolution transmission electron microscopy (JEOL 2010) of the consolidated material. Transmission electron microscopy was also performed on the powder before consolidation. The four-probe electrical conductivity (σ) and the Seebeck coefficient (S) were measured in a commercial system (ZEM-3, ULVAC-RIKO). The thermal conductivity (k) was measured using a laser flash system (LFA 457, Netzsch).

Figure 2A:
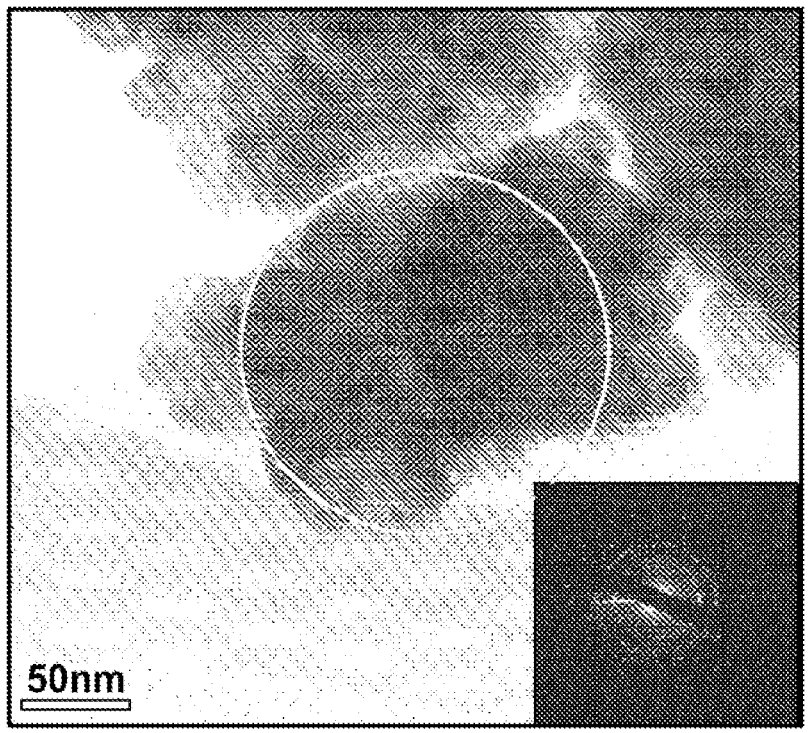
FIG. 2a presents a transmission electron micrograph image of a ball milled sample particles before hot pressing, consistent with some embodiments of the invention.
Figure 2B:
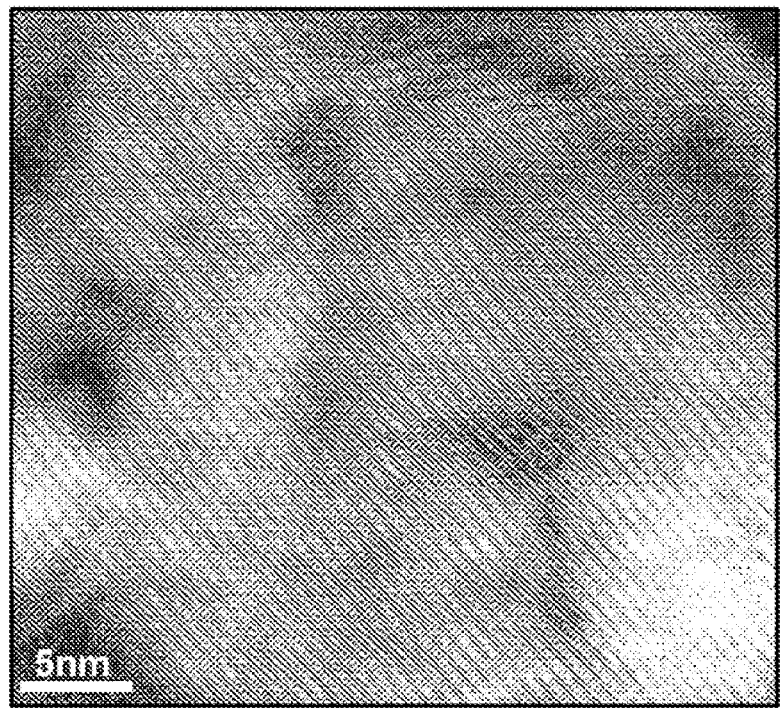

FIGS. 2a and 2b present different magnifications of transmission electron micrographs (TEMs) of a ball milled sample of particles having a composition of $Yb_xCo_4Sb_{12}$ before the particles were hot pressed. FIG. 2a has a bar indicating a length scale of 50 nm at the lower left of the image; FIG. 2b has a bar indicating a length scale of about 5 nm. The micrographs indicate that the typical particle size was about 10 nm to about 20 nm.

Figure 3:
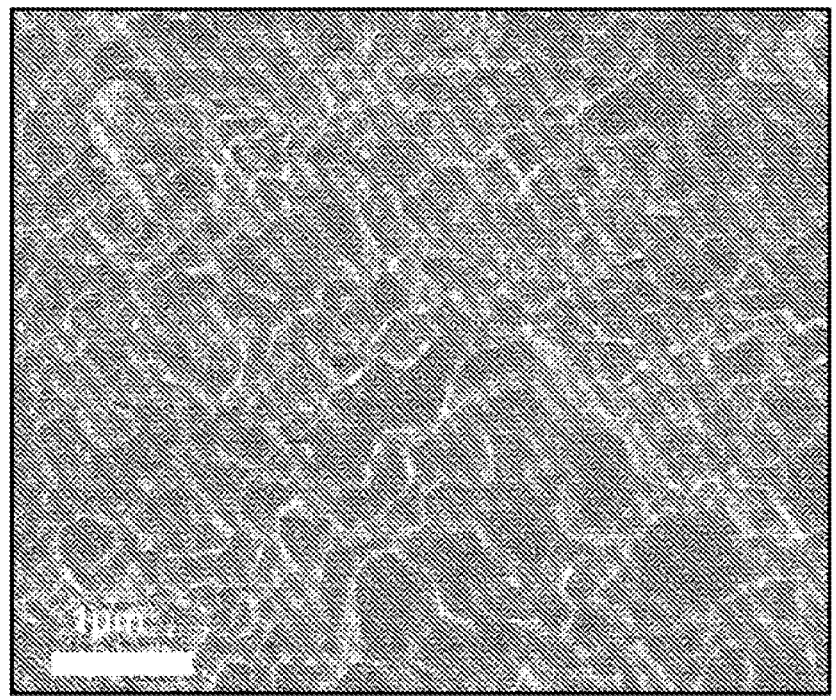
FIG. 3 presents a scanning electron microscopy image of a DC hot pressed sample of $Yb_{0.35}Co_4Sb_{12}$, in accord with some embodiments.

FIG. 3 shows an scanning electron microscopy (SEM) image of a DC hot pressed sample corresponding to $Yb_{0.35}Co_4Sb_{12}$. The SEM indicates that the average grain size was about 200 nm to about 300 nm. The clear facets show that the grains were well crystallized. The SEM image also shows that the crystallized grains were closely packed, implying a high volume mass density consistent with the volume mass density measurement of around 7.6 g/cm³, which is about the theoretical density of the composition.

Figure 4:
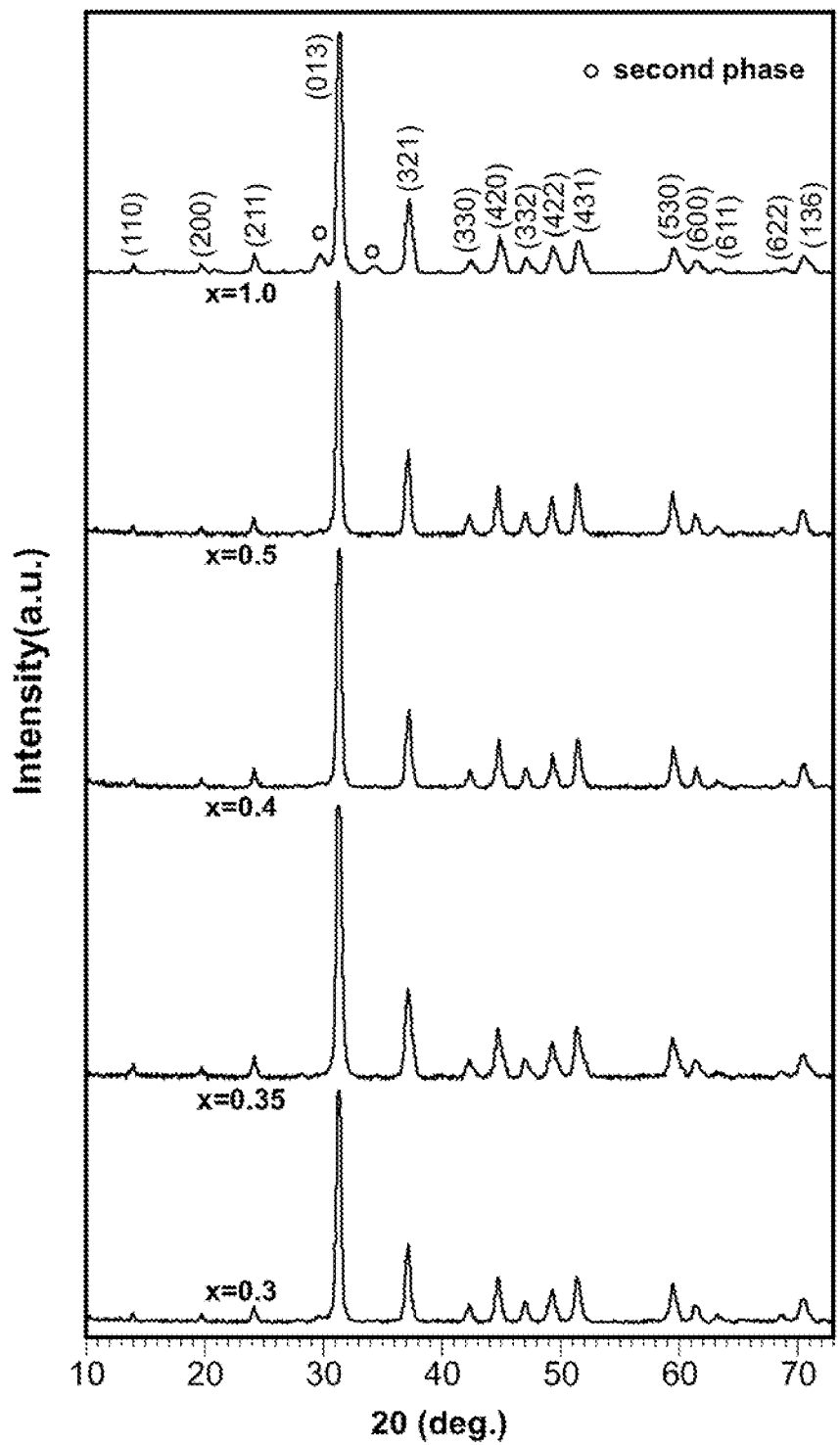
FIG. 4 presents superimposed graphs of intensity versus angle 2θ taken from x-ray diffraction scans of five hot-pressed samples each having a stoichiometry corresponding with the formula $Yb_xCo_4Sb_{12}$, where for individual samples x is equal to one of 0.3, 0.35, 0.4, 0.5 and 1.0, consistent with some embodiments.

X-ray diffraction (XRD) spectra of the ball milled nanopowders indicated that only a very small portion of the powders were alloyed, regardless of the ball milling time. After the DC hot press, however, XRD spectra showed that the powder was completely transformed into a single skutterudite phase for x values from 0.2 up to about 0.5. An unknown second phase was created for the sample when x is about 1. Overlaid XRD spectra of the various hot pressed samples are shown in FIG. 4. The unknown second phase in the case of x=1.0 is clearly marked in the top graph of FIG. 4.

Figure 5A:
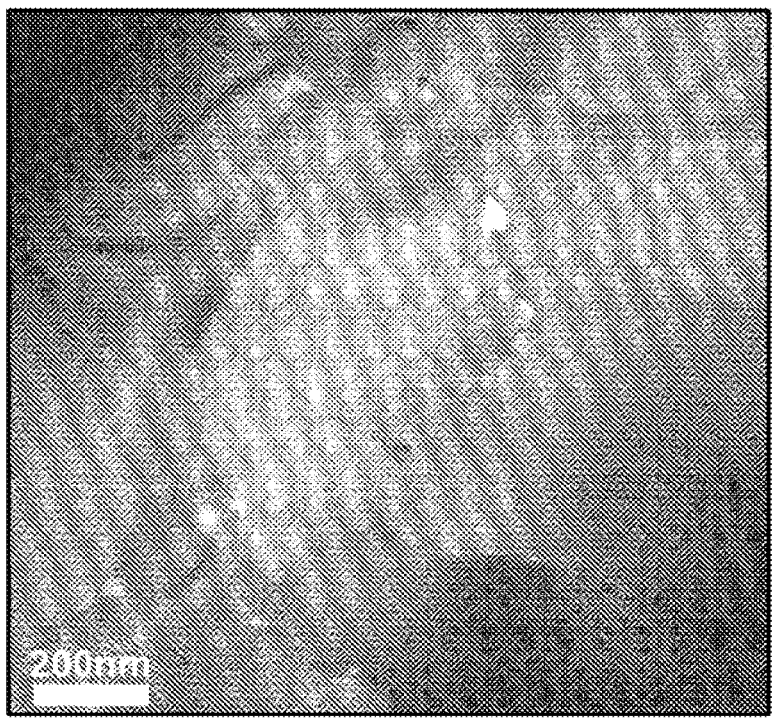
FIG. 5a presents a transmission electron microscopy image of a hot pressed sample having a composition following the formula $Yb_{0.35}Co_4Sb_{12}$, consistent with some embodiments.
Figure 5B:
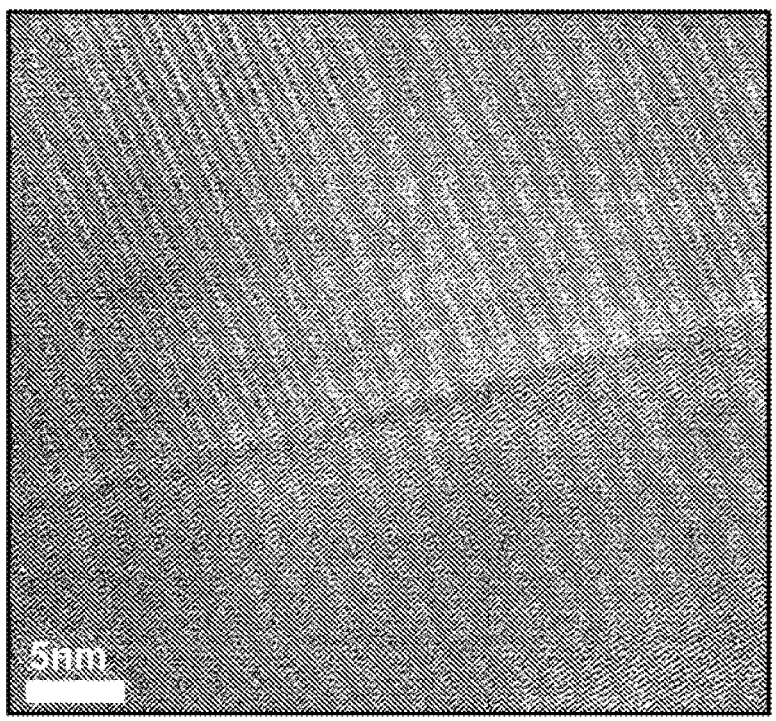
FIG. 5b presents a transmission electron microscopy image of the hot pressed sample shown in FIG. 5a at higher magnification.

FIG. 5a shows a low magnification TEM image of a sample with the composition $Yb_{0.35}Co_4Sb_{12}$ after DC hot pressing the sample. The image indicates that the grains are about several hundred nanometers in size, consistent with the SEM observation. The high resolution TEM image shown in FIG. 5b confirms the excellent crystallinity, clean grain boundary, and large angle grain boundary. The excellent crystallinity and clean grain boundary typically are needed for good electrical transport properties, whereas the large angle grain boundary can potentially benefit phonon scattering.

TABLE I

| Composition | Electrical Conductivity ($10^5$ S/m) | Seebeck Coefficient (μV/K) | Lattice Thermal Conductivity (W/m K) | ZT |
|---|---|---|---|---|
| $Yb_{0.066}Co_4Sb_{12}$* | 0.48 | −186 | 4.7 | 0.09 |
| $Yb_{0.19}Co_4Sb_{12}$* | 1.64 | −141 | 2.6 | 0.26 |
| $Yb_{0.3}Co_4Sb_{12}$ | 1.99 | −137 | 1.52 | 0.38 |
| $Yb_{0.35}Co_4Sb_{12}$ | 2.13 | −130 | 1.35 | 0.37 |
| $Yb_{0.4}Co_4Sb_{12}$ | 2.34 | −120 | 1.21 | 0.35 |
| $Yb_{0.5}Co_4Sb_{12}$ | 2.54 | −108 | 1.08 | 0.30 |

Table I shows the nominal compositions of the various samples and their measured properties at about 25° C. In addition, two samples (marked with *) as prepared and characterized in Nolas et al., J. Appl, Phys. 77, 1855 (2000) are also listed for comparison. The lattice thermal conductivity was estimated by using the Weidemann-Franz law ($k_L=k-k_e$, with $k_e=L_0\sigma T$, where the Lorenz number $L_0$ of $2.44\times10^{-8}V^2/K^2$ was used, σ is the electrical conductivity, and T is the absolute temperature. The tested samples show a much higher electrical conductivity vis-à-vis Nolas et al.'s samples.

Figure 6:
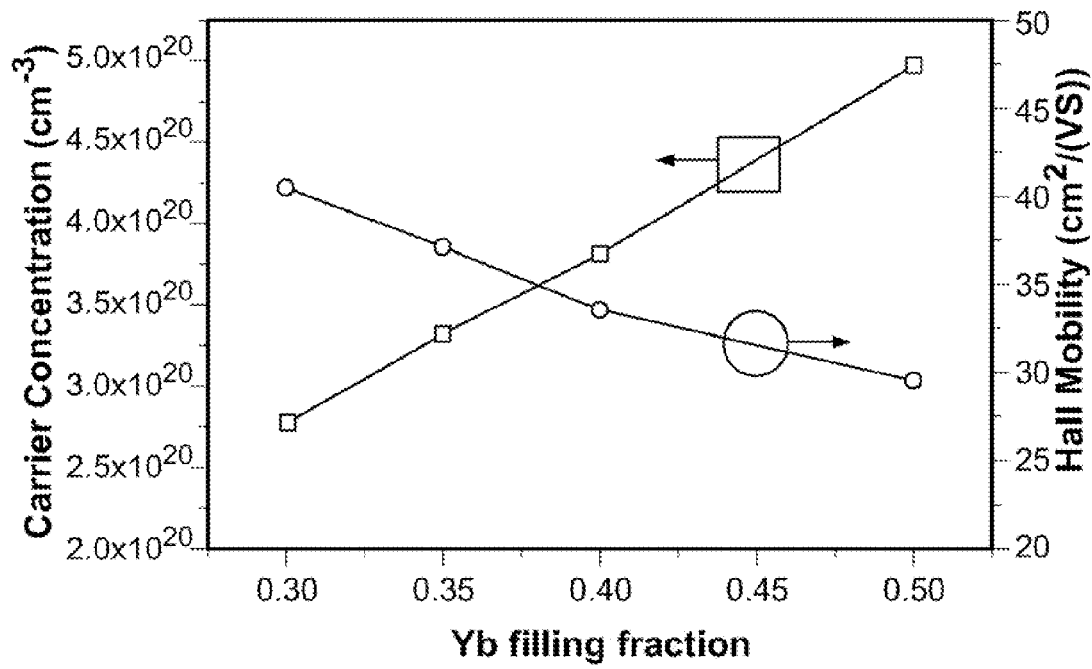
FIG. 6 presents graphs of carrier concentration and Hall mobility at room temperature for various hot pressed samples having a stoichiometry consistent with the formula $Yb_xCo_4Sb_{12}$, where x ranges from 0.3 to 0.5, consistent with some embodiments.

FIG. 6 presents a combined graph of the carrier concentrations and Hall mobilities of samples as a function of Yb doping level x up to x=0.5 at room temperature. The carrier concentrations for $Yb_xCo_4Sb_{12}$ are in a linear relation with the Yb filling value x. The Hall mobilities drop with higher Yb filling fraction. However, the carrier concentration increase is much larger that the carrier mobility decrease, which is why the electrical conductivity increases with increasing Yb doping.

Figure 7A:
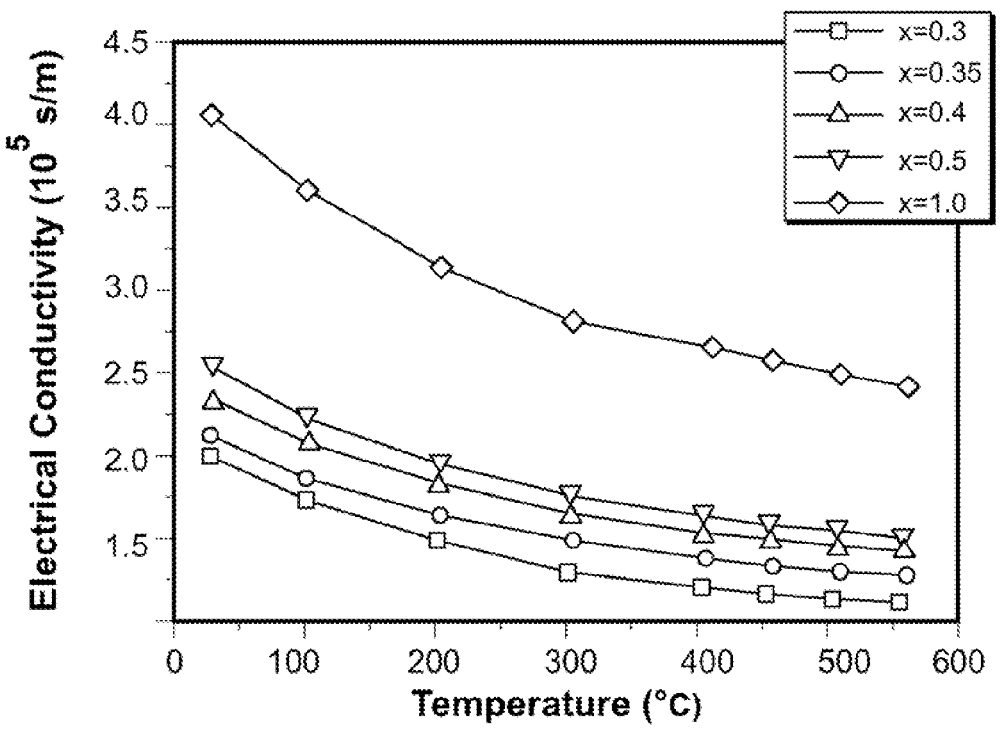
FIG. 7a presents graphs of the measured electrical conductivity as a function of temperature for hot pressed samples consistent with the formula $Yb_xCo_4Sb_{12}$, where x is 0.3, 0.35, 0.4, 0.5, and 1, consistent with some embodiments.
Figure 7B:
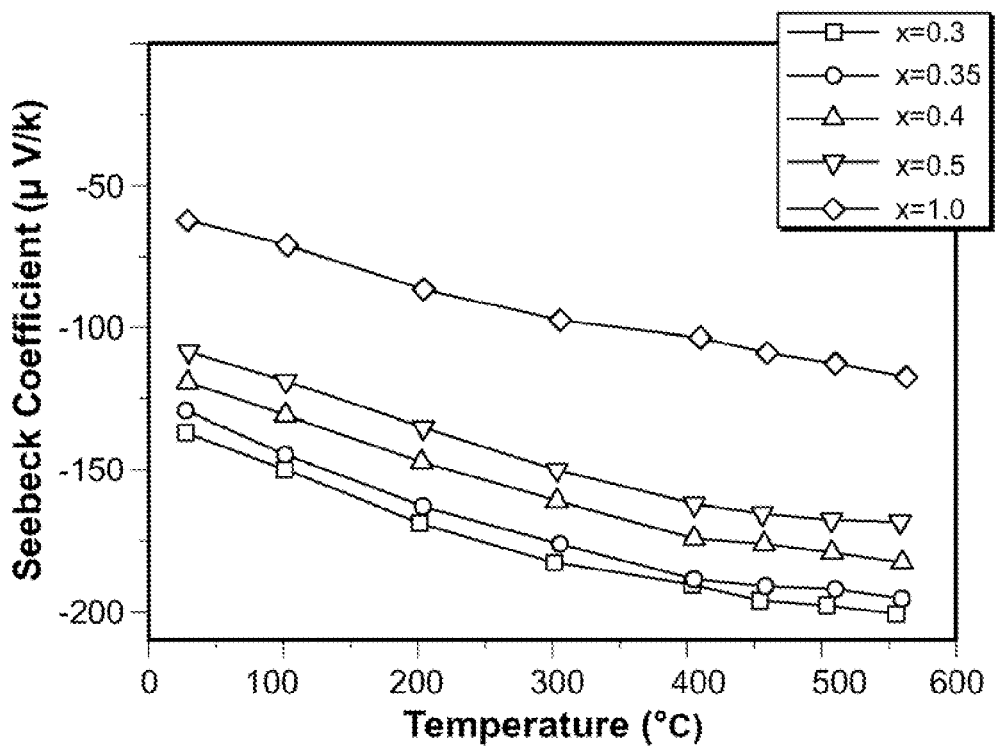

The measured and calculate temperature dependent thermoelectric properties of the $Yb_xCo_4Sb_{12}$ samples are plotted in FIGS. 7a-7d. All samples have negative Seebeck coefficients (FIG. 7b), indicating that electrons are the dominant carriers. As shown in FIG. 7a, all samples show metallic electrical conducting behavior whereby σ drops with increasing temperature. Also σ increases with increasing Yb content. Samples with different Yb content show a similar temperature dependence trend for the Seebeck coefficient from room temperature to 550° C., with the maximum Seebeck coefficient at about 550° C. (FIG. 7b). The absolute value of the Seebeck coefficient decreases with increasing x at the same temperature, consistent with the electrical conductivity increases with increasing values of x.

Figure 7C:
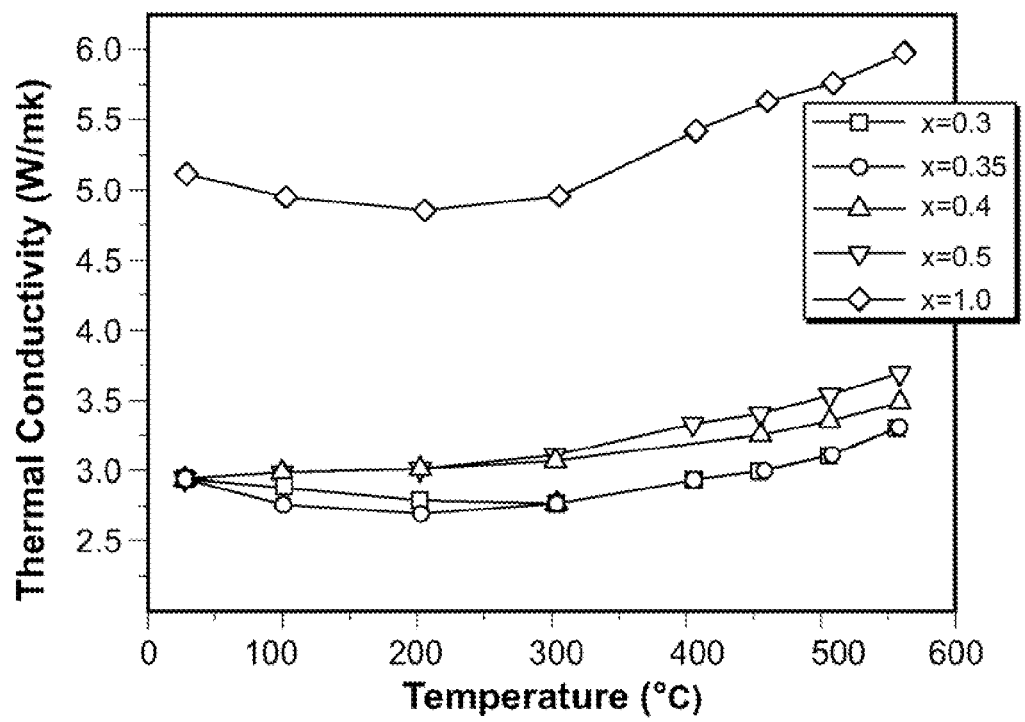

The thermal conductivity of the samples is shown in FIG. 7c. For the samples with x=0.3 and 0.35, the thermal conductivity values decrease with temperature and reach a minimum at 300° C. and then increases rapidly with temperature. For the samples with x=0.4 and 0.5, the thermal conductivity keeps rising all the way from room temperature to 550° C. Increases in Yb content increase the electron contribution to the total thermal conductivity. At the same time, more Yb can decrease the lattice contribution. Accordingly, $Yb_{0.35}Co_4Sb_{12}$ has an optimized lowest thermal conductivity with a minimum of 2.7 W/m·K, which leads to the optimal ZT profile.

Figure 7D:
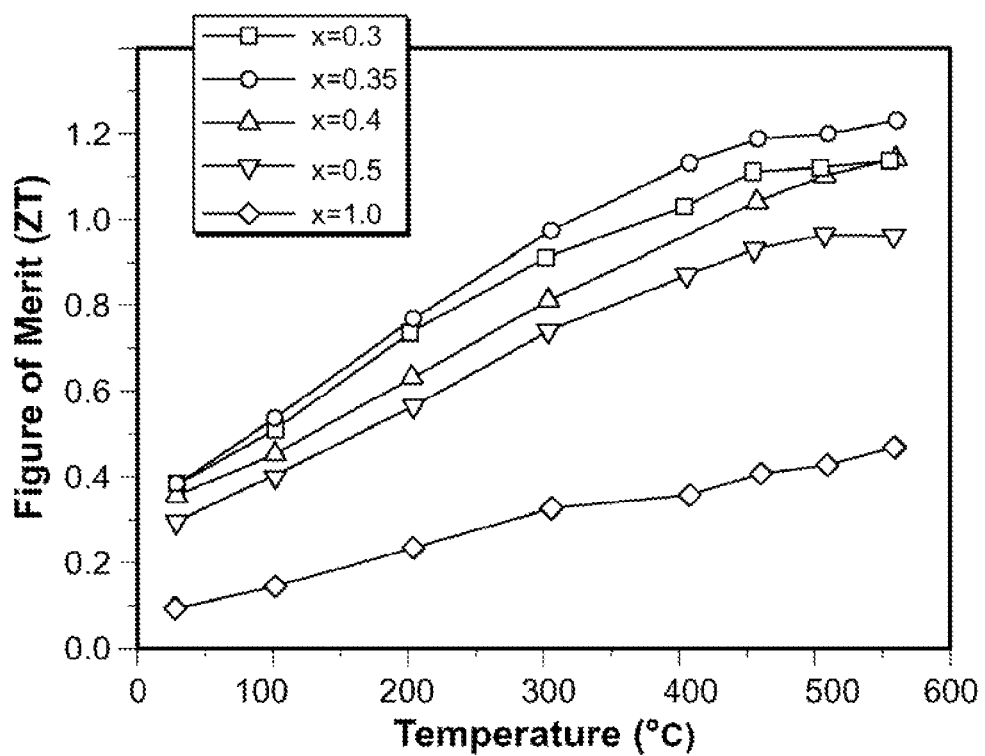

FIG. 7d shows the temperature dependent ZT from room temperature to 550° C. The ZT value increases with temperature and reaches a maximum at around 550° C. The highest ZT is observed for the $Yb_{0.35}Co_4Sb_{12}$ sample with its maximum value of about 1.2 occurring at 550° C. This is about a 30% improvement in ZT value relative to state-of-the-art commercial n-type $Co_4Sb_{12}$.

Experimental Set 2

N-Type $Co_4Sb_{12}$-Based Skutterudites Doped with Other Filler Atoms

Samples of $Co_4Sb_{12}$-based n-type materials were prepared and tested having various amounts of ytterbium, neodymium, and lanthanum. In addition, samples of $Co_4Sb_{12}$-based n-type materials were prepared and tested having two types of filler atoms: one being ytterbium and the other being one of the other rare earth elements (e.g., neodymium, lanthanum) or a Group IIA element (e.g., barium).

Samples were prepared by simultaneously ball milling elemental bulk materials of the appropriate constituents into particulates, where the bulk materials had a stoichiometry similar to the desired final material. Ball-milling resulted in the formation of nanoparticles having a size from about 1 nm to about 100 nm. The particulates were consolidated using a DC hot press, as described in Experimental Set 1, using similar parameters. The thermoelectric properties of the various samples were measured using the techniques and equipment described in Experimental Set 1.

Figure 8A:
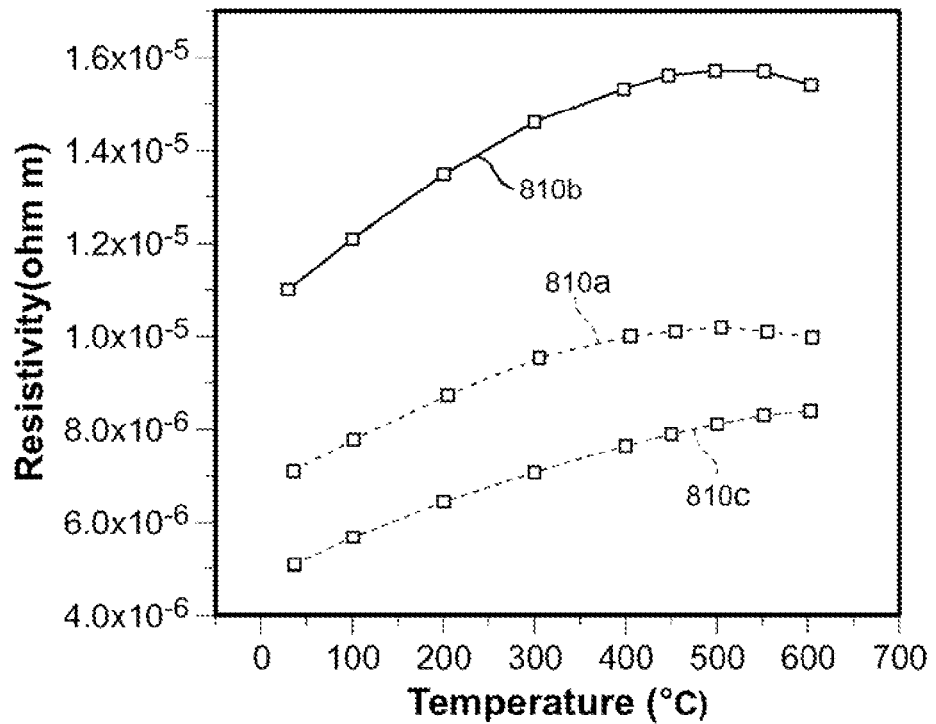
FIG. 8a presents graphs of the measured resistivity as a function of temperature for hot pressed samples having the following stoichiometries: $La_{0.3}Co_4Sb_{12}$, $Nd_{0.3}Co_4Sb_{12}$, and $Yb_{0.3}Co_4Sb_{12}$, consistent with some embodiments.
Figure 8B:
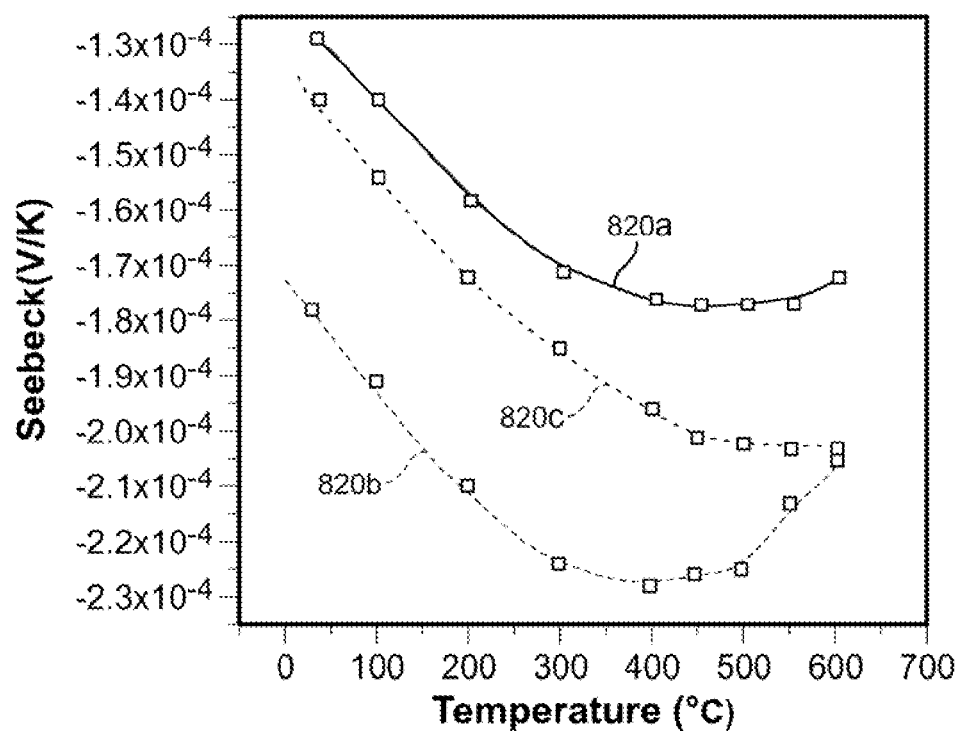
Figure 8C:
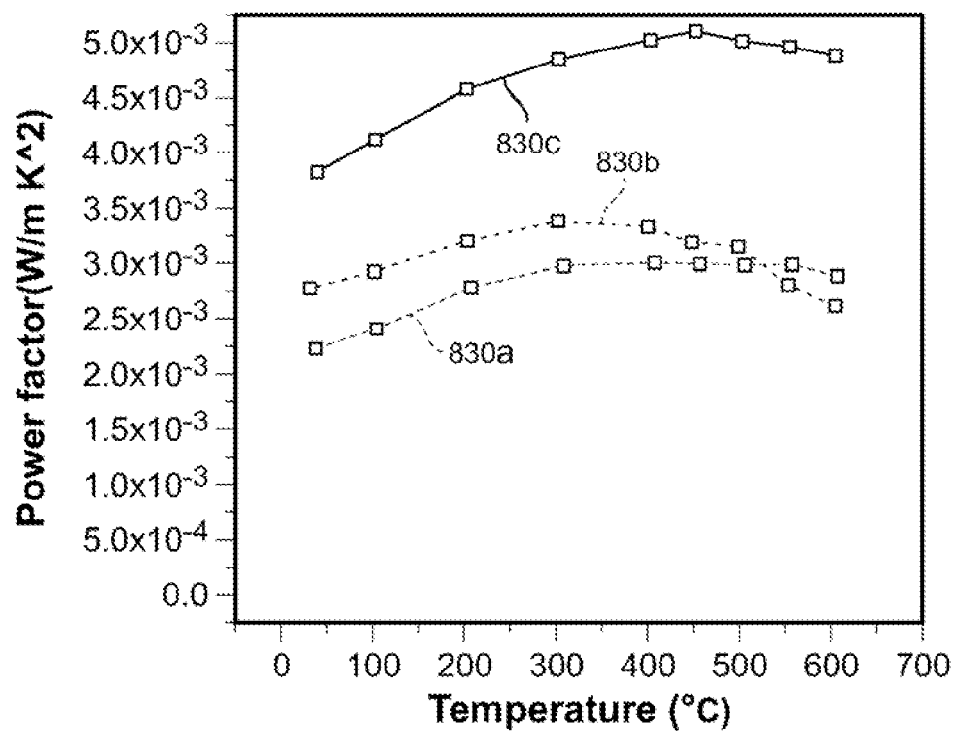
Figure 8D:
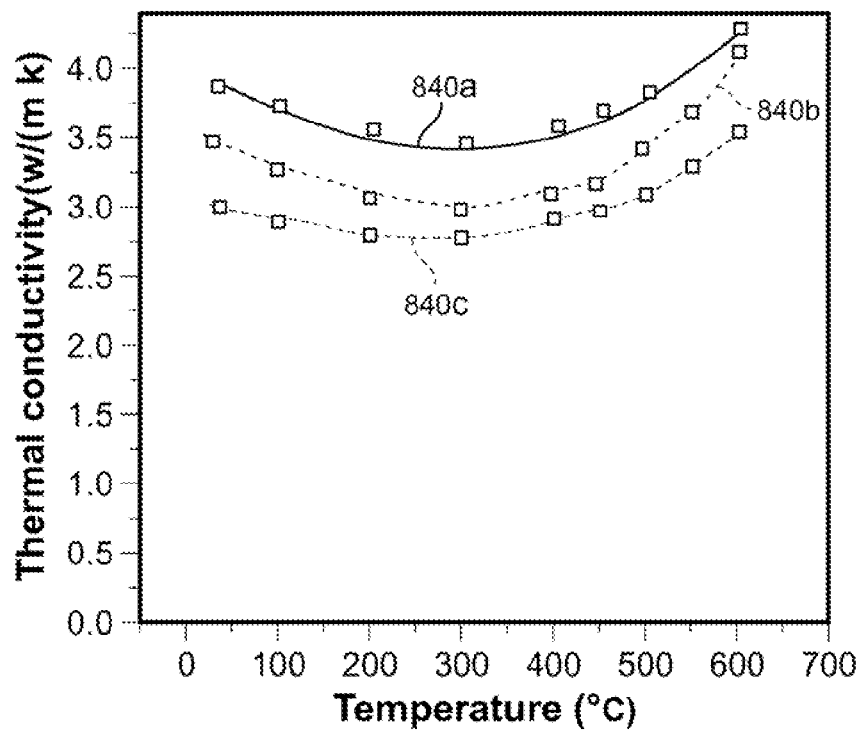
Figure 8E:
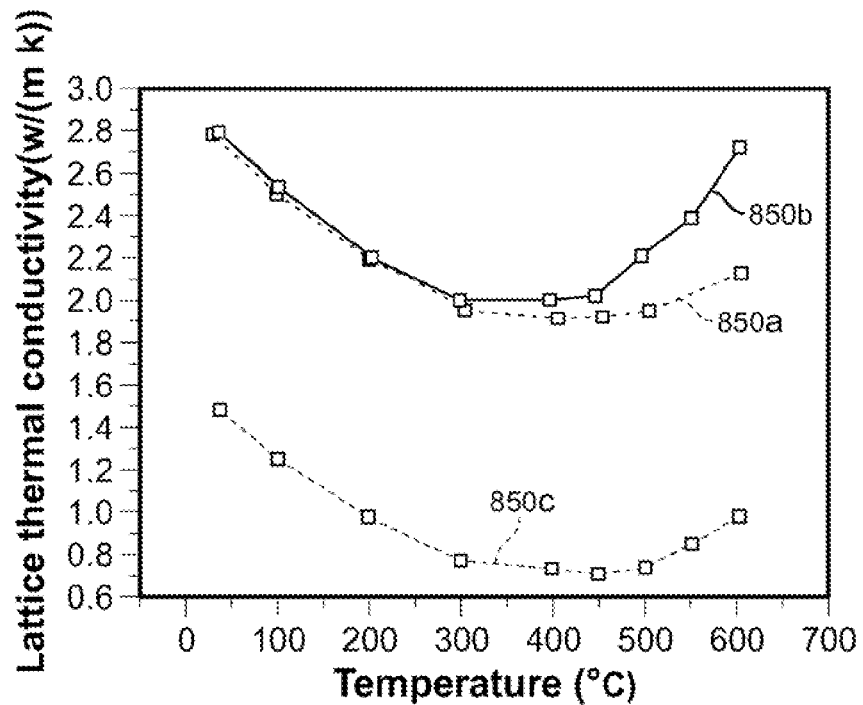
Figure 8F:
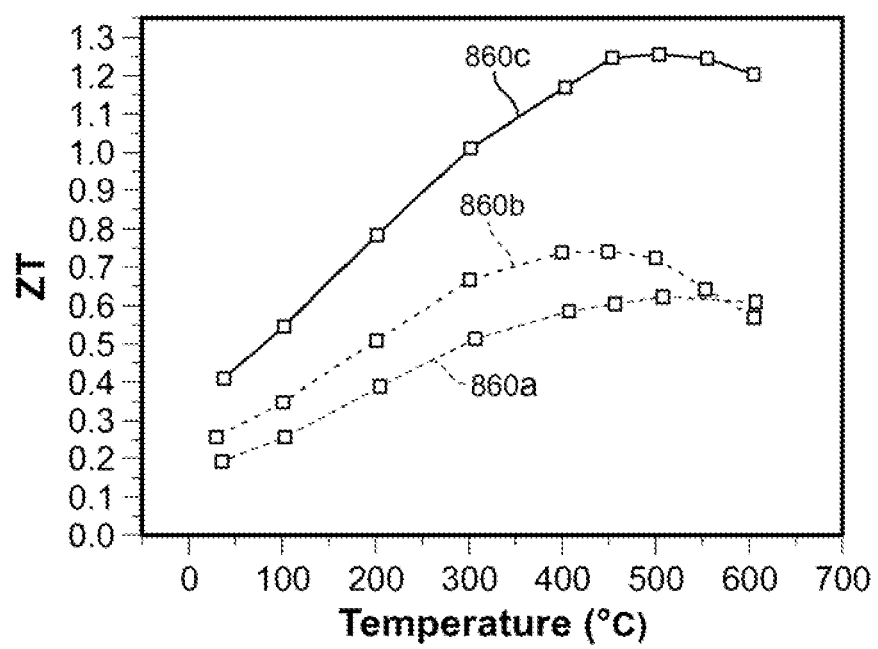

The comparative thermoelectric properties of the some of the various samples are shown in FIGS. 8a-8f. In particular, FIGS. 8a-8d graph the resistivity, Seebeck coefficient, power factor, and thermal conductivity, respectively, as a function of temperature for three samples: $La_{0.3}Co_4Sb_{12}$, $Nd_{0.3}Co_4Sb_{12}$, and $Yb_{0.3}Co_4Sb_{12}$. The lattice thermal conductivity as a function of temperature is shown in FIG. 8e, and ZT is plotted as a function of temperature for all three samples in FIG. 8f. In particular, graphs 810a, 820a, 830a, 840a, 850a, 860a correspond to a $La_{0.3}Co_4Sb_{12}$ sample; graphs 810b, 820b, 830b, 840b, 850b, 860b correspond to a $Nd_{0.3}Co_4Sb_{12}$ sample; and graphs 810c, 820c, 830c, 840c, 850c, 860c correspond to a $Yb_{0.3}Co_4Sb_{12}$ sample. Though the neodymium-doped sample generally has a larger magnitude Seebeck coefficient, the substantially lower lattice thermal conductivity of the ytterbium-doped sample leads to the best ZT values of the three samples at the tested temperatures.

Figure 9A:
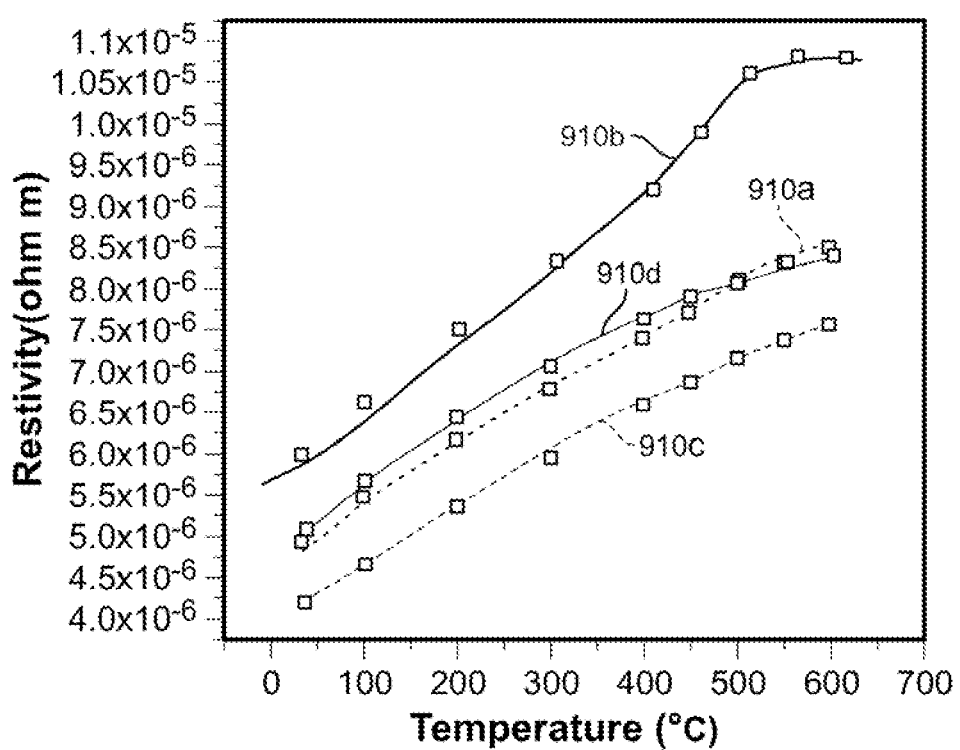
FIG. 9a presents graphs of the measured resistivity as a function of temperature for hot pressed samples having the following stoichiometries: $La_{0.1}Yb_{0.3}Co_4Sb_{12}$, $Ce_{0.03}Yb_{0.3}Co_4Sb_{12}$, $Ba_{0.1}Yb_{0.3}Co_4Sb_{12}$, and $Yb_{0.3}Co_4Sb_{12}$, consistent with some embodiments.
Figure 9B:
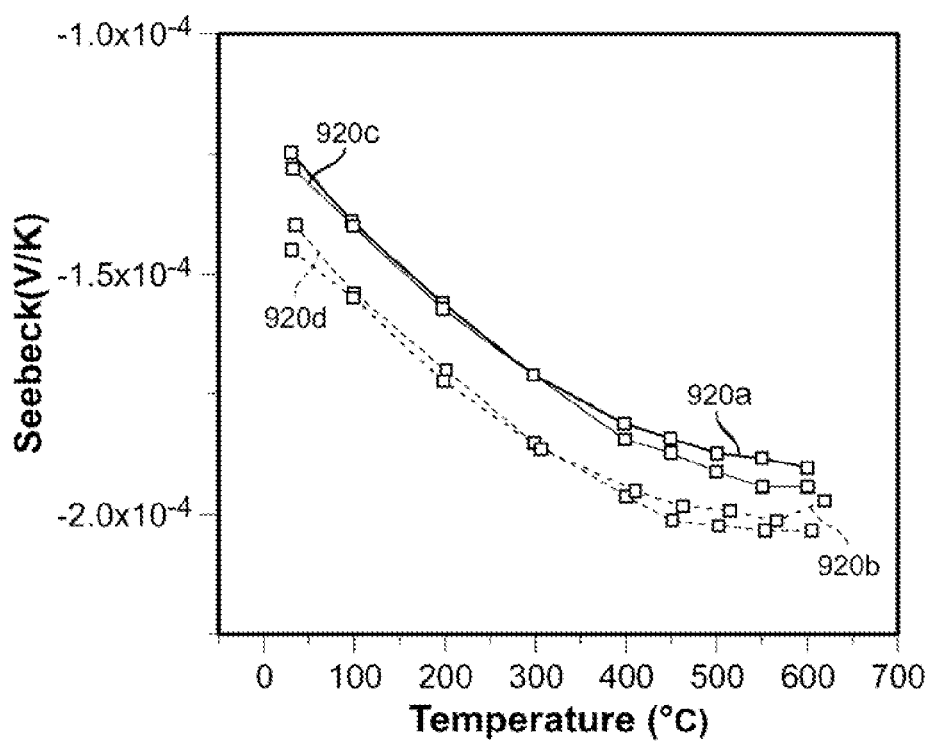
Figure 9C:
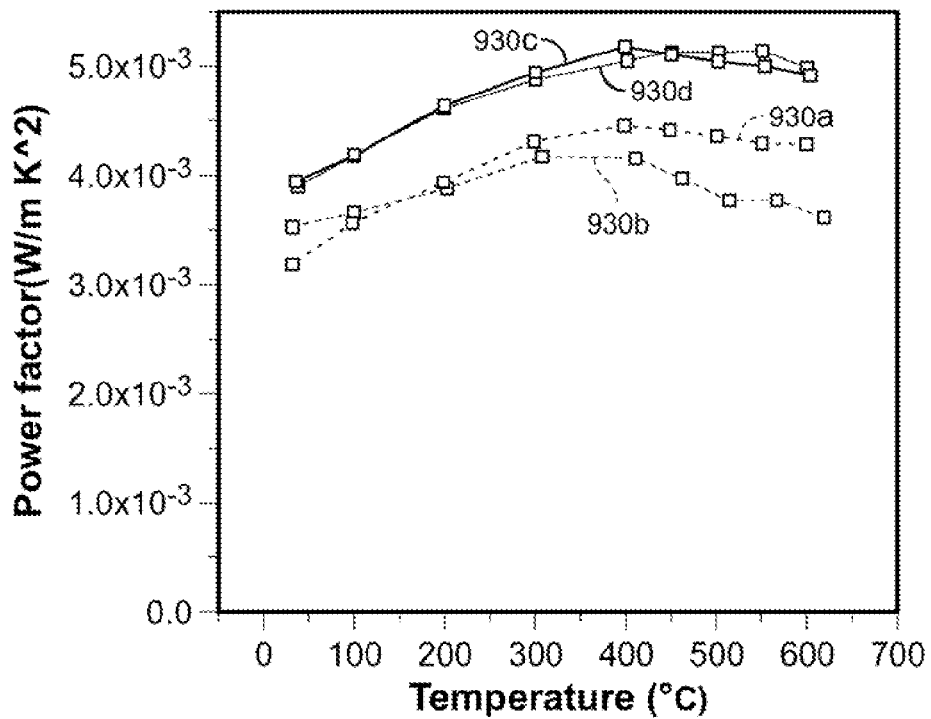
Figure 9D:
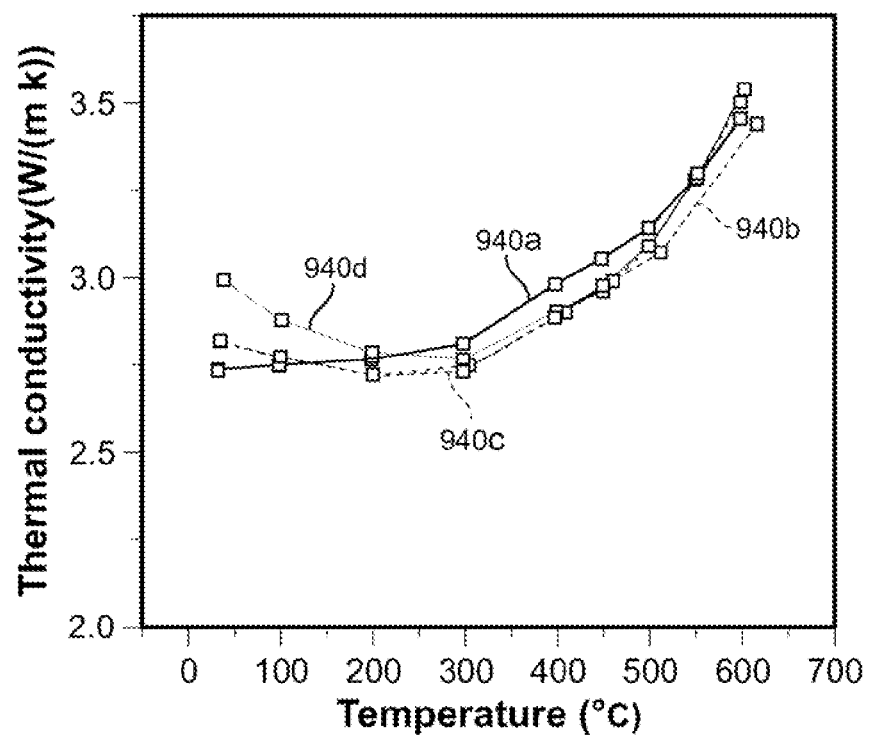
Figure 9E:
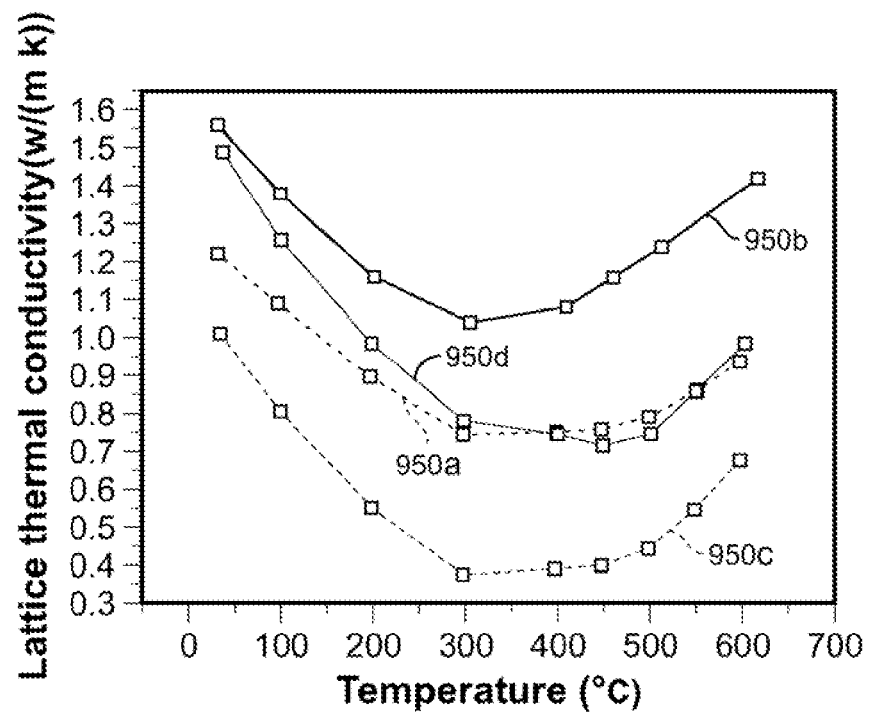
Figure 9F:
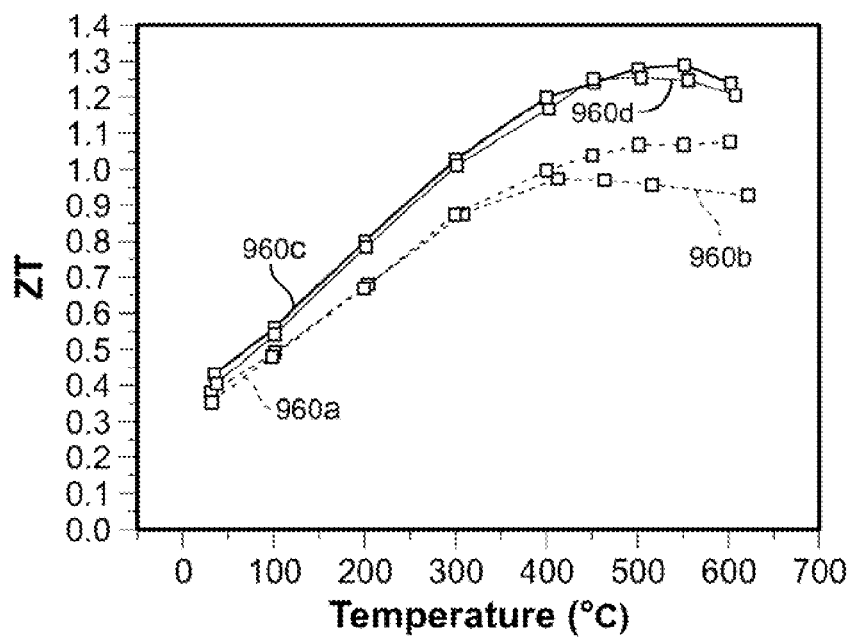

Comparative thermoelectric properties of some dual filler type samples are shown in FIGS. 9a-9f. FIGS. 9a-9d graph the resistivity, Seebeck coefficient, power factor, and thermal conductivity, respectively, as a function of temperature for three samples having two types of filler atoms ($La_{0.1}Yb_{0.3}Co_4Sb_{12}$, $Ce_{0.03}Yb_{0.3}Co_4Sb_{12}$, and $Ba_{0.1}Yb_{0.3}Co_4Sb_{12}$) and a sample of $Yb_{0.3}Co_4Sb_{12}$. The lattice thermal conductivity as a function of temperature is shown in FIG. 9e, and ZT is plotted as a function of temperature for all three samples in FIG. 9f. In particular, graphs 910a, 920a, 930a, 940a, 950a, 960a correspond to a $La_{0.1}Yb_{0.3}Co_4Sb_{12}$ sample; graphs 910b, 920b, 930b, 940b, 950b, 960b correspond to a $Ce_{0.03}Yb_{0.3}Co_4Sb_{12}$ sample; graphs 910c, 920c, 930c, 940c, 950c, 960c correspond to a $Ba_{0.1}Yb_{0.3}Co_4Sb_{12}$ sample; and graphs 910d, 920d, 930d, 940d, 950d, 960d correspond to a $Yb_{0.3}Co_4Sb_{12}$ sample. Generally, the best results for the ZT values appears to be associated with the sample utilizing both barium and ytterbium as filler atoms.

Experimental Set 3

P-Type $Co_4Sb_{12}$-Based Skutterudites with Filler Atoms

Samples of p-type skutterudite-based materials were prepared with filler atoms of one or more of cerium, ytterbium, neodymium, and lanthanum. In particular, the samples tested had the following stoichimetries: $NdFe_{3.5}Co_{0.5}Sb_{12}$, $Nd_{0.9}Fe_{3.5}Co_{0.5}Sb_{12}$, $CeFe_{3.5}Co_{0.5}Sb_{12}$, $LaFe_{3.5}Co_{0.5}Sb_{12}$, $YbFe_{3.5}Co_{0.5}Sb_{12}$, and $La_{0.9}Yb_{0.1}Fe_{3.5}Co_{0.5}Sb_{12}$.

Samples were prepared by loading the individual elements of each desired sample in the correct stoichiometric ratio into a high energy Spex ball milling jar. The starting materials were grinded for 15 to 25 hours to form small particles. The particles were compacted into a disk using a DC hot press. In general, the conditions of pressing were to hold the sample at 600° C. for 5 minutes then for 2 minutes at 700° C. at a constant pressure of 20-80 MPa. Before measurements were taken, the individual samples were annealed at 550° C. for about 2 hours in a flowing argon environment. TEM and SEM imaging was performed on the powder and consolidated samples, along with x-ray diffraction. The thermoelectric properties of the various samples were measured using the techniques and equipment described in Experimental Set 1.

Figure 10A:
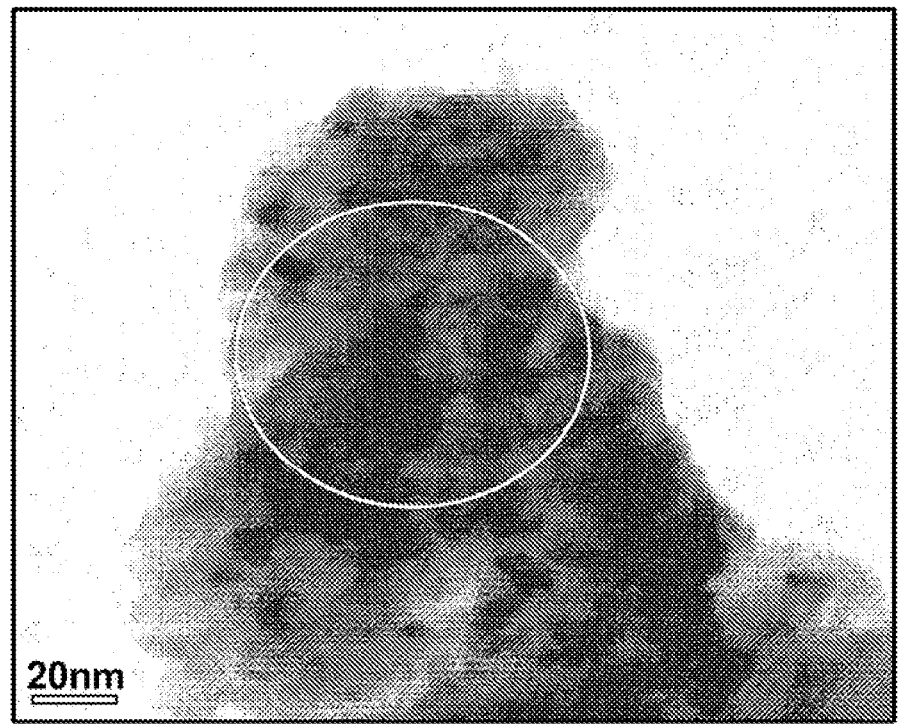
FIG. 10a presents a transmission electron microscopy image of particles having a composition consistent with the formula $CeFe_{3.5}Co_{0.5}Sb_{12}$ after 20 hours of ball milling, consistent with some embodiments.
Figure 10B:
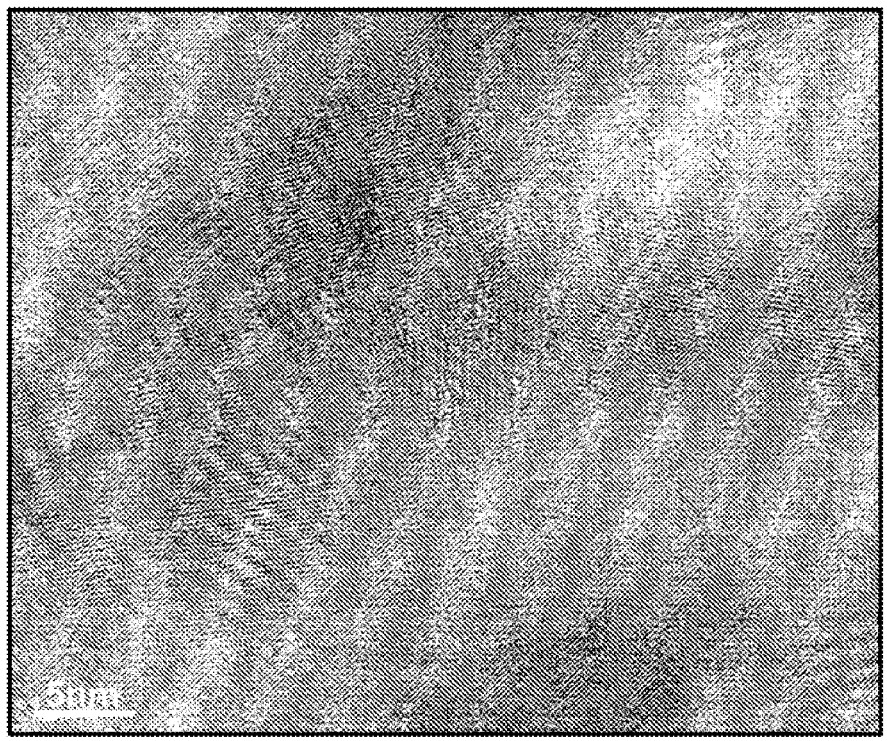
FIG. 10b presents a transmission electron microscopy image of the particles of FIG. 10a at a higher magnification.

FIGS. 10a and 10b present two magnifications of TEM images of a ball-milled sample of starting materials having a stoichiometry ratio consistent with $CeFe_{3.5}Co_{0.5}Sb_{12}$ after 20 hours of ball milling. The bar in the lower left of FIG. 10a corresponds with a length of 20 nm, and the bar in the lower left of FIG. 10b corresponds with a length of 5 nm. The images indicated a particle size in the range of about 10 nm to about 30 nm. X-ray diffraction analysis on the ball-milled powder indicated the powder was not alloyed. Using the Scherrer equation, a particle size of about 15 nm was calculated, in generally good agreement with the TEM images.

Figure 11A:
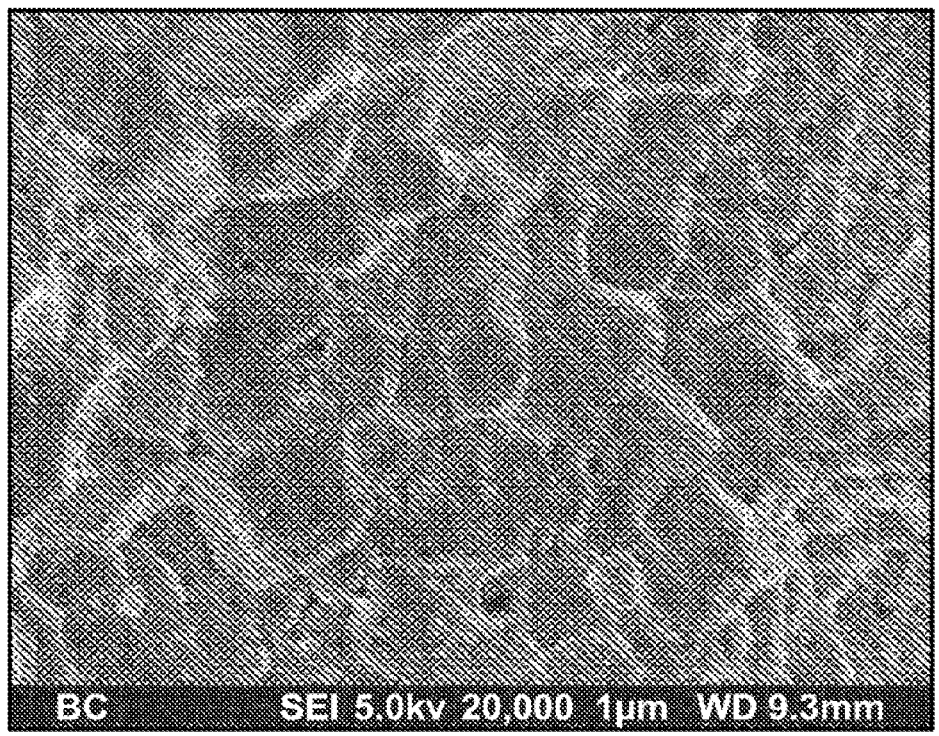
FIG. 11a presents a scanning electron microscopy image of a DC hot pressed sample of particles made from materials having the stoichiometry $CeFe_{3.5}Co_{0.5}Sb_{12}$ after 20 hours of ball milling, consistent with some embodiments.
Figure 11B:
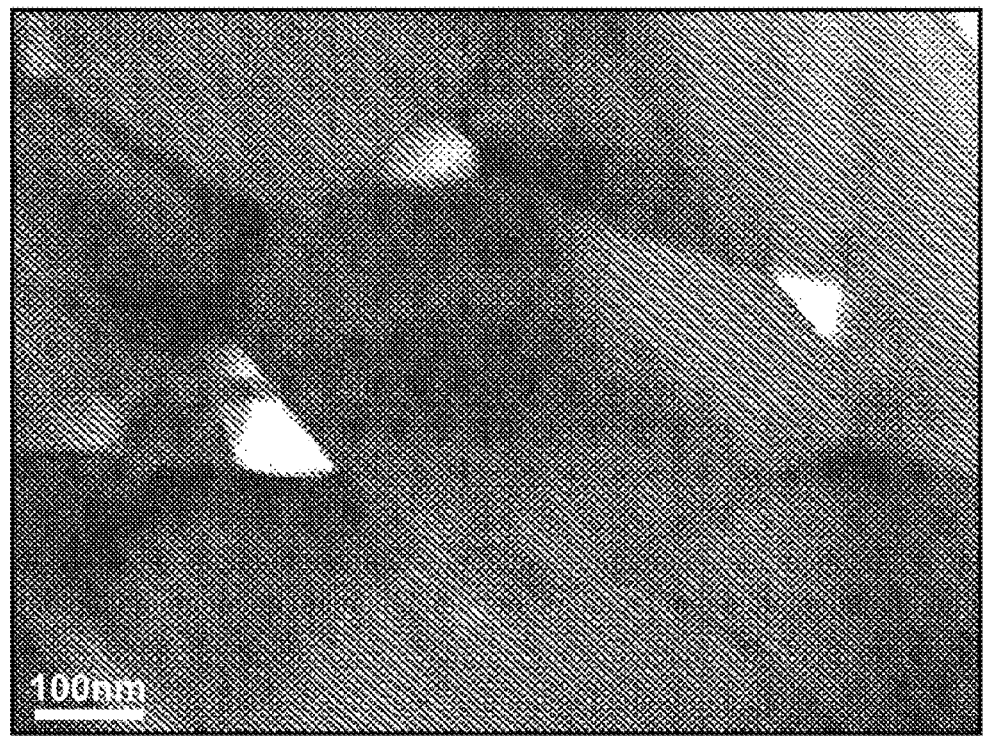

FIGS. 11a and 11b present a SEM image and a TEM image, respectively, of the $CeFe_{3.5}Co_{0.5}Sb_{12}$ sample after DC hot pressing. In conjunction with x-ray diffraction analysis done on the consolidated sample, the results indicated alloying occurred during the hot press. An average grain size of about 91 nm was calculated from the Scherrer equation, consistent with what is shown in the imaging.

Figure 12A:
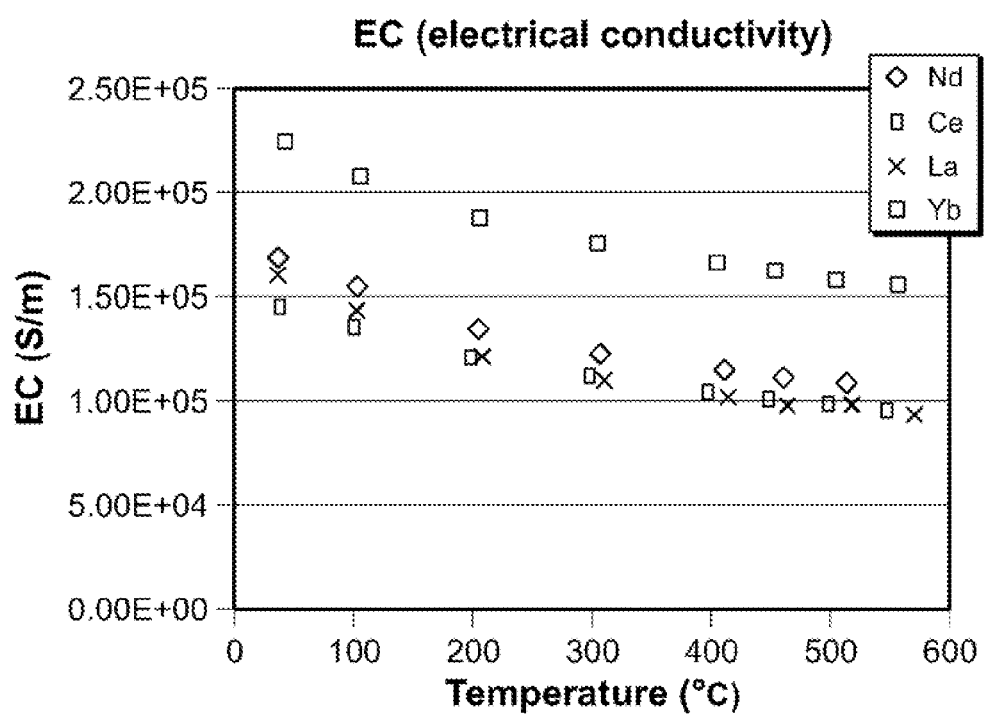
FIG. 12a presents graphed data of the measured electrical conductivity as a function of temperature for hot pressed samples of particles having the stoichiometry $NdFe_{3.5}Co_{0.5}Sb_{12}$, where individual samples used particles ball milled for 15, 20, or 25 hours, consistent with some embodiments.
Figure 12B:
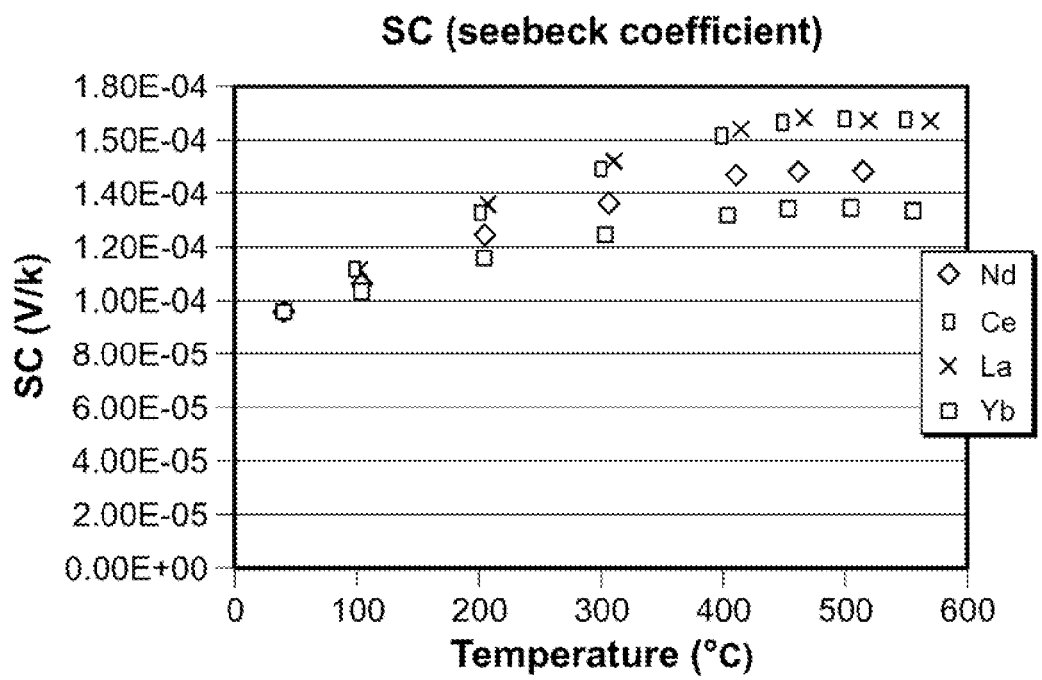
Figure 12C:
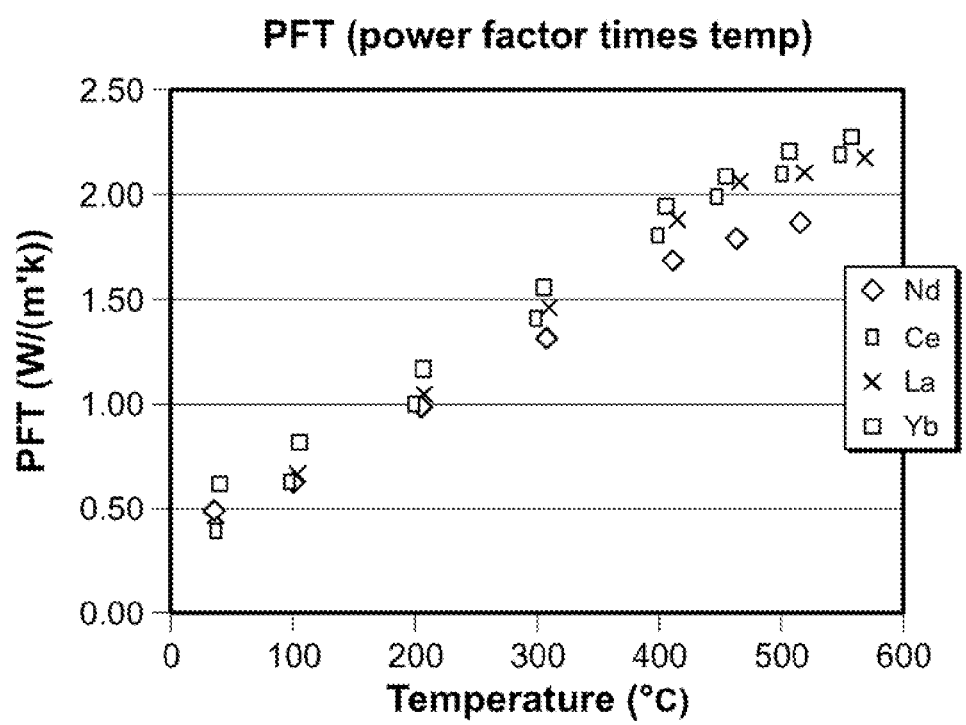
Figure 12D:
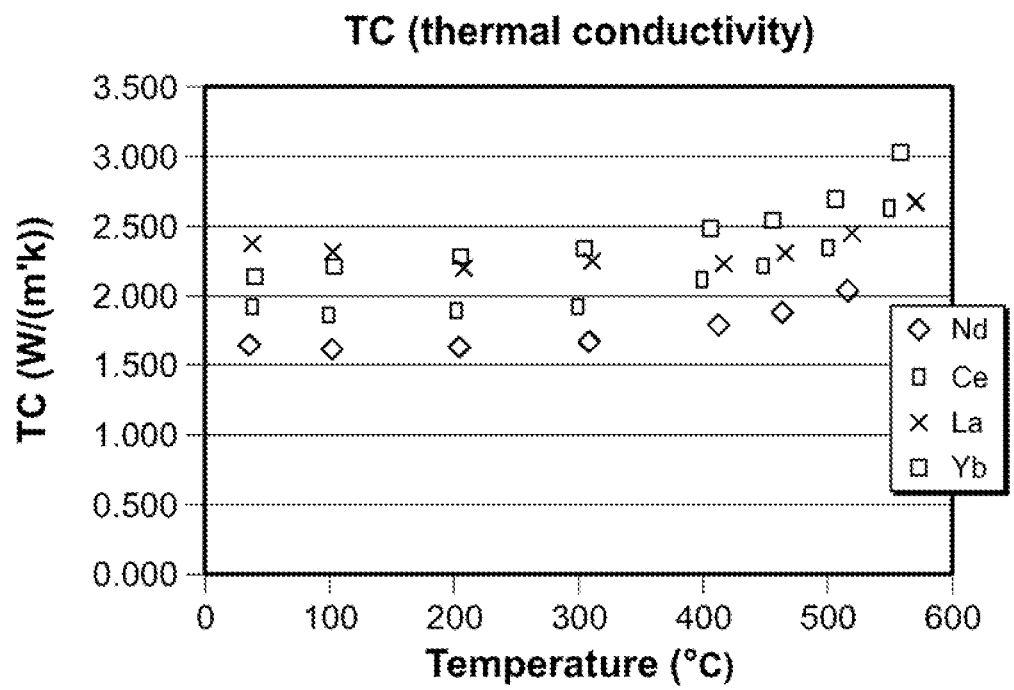
Figure 12E:
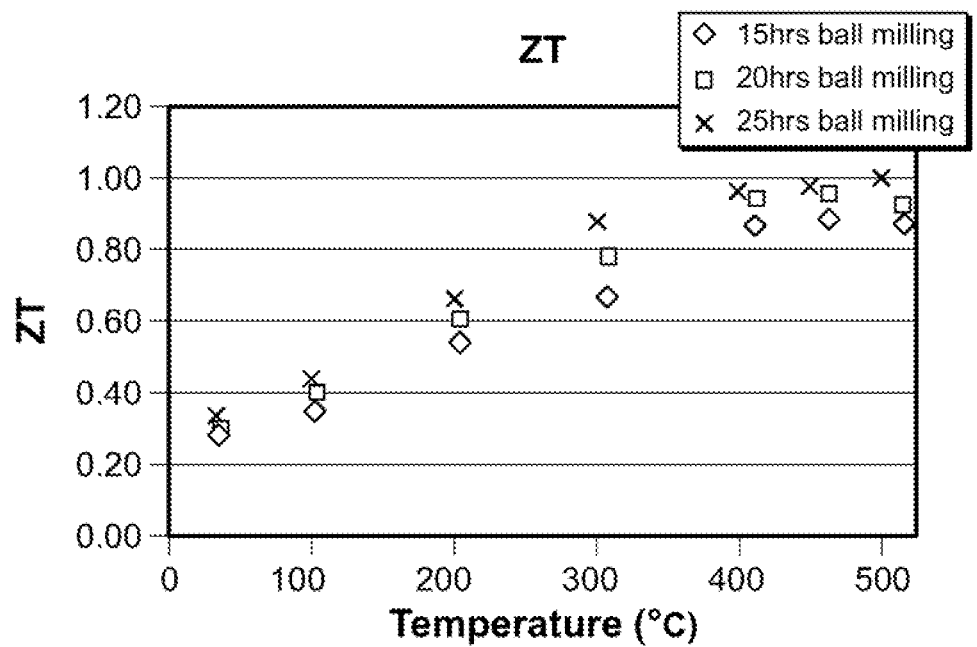

FIGS. 12a-12e present graphs of the comparative thermoelectric properties of three $NdFe_{3.5}Co_{0.5}Sb_{12}$ samples. Each sample ball-milled for a different amounts of time, either 15, 20, or 25 hours. FIGS. 12a-12d present graphs of the electrical conductivity, Seebeck coefficient, the product of the power factor and temperature, and thermal conductivity, respectively, as a function of temperature for each of the three different ball-milled samples. FIG. 12e presents a comparative graph of the ZT value as a function of temperature for the three samples. In general, the longer ball milled samples result in a higher ZT value, which appears to generally peak at about 475° C.

Figure 13A:
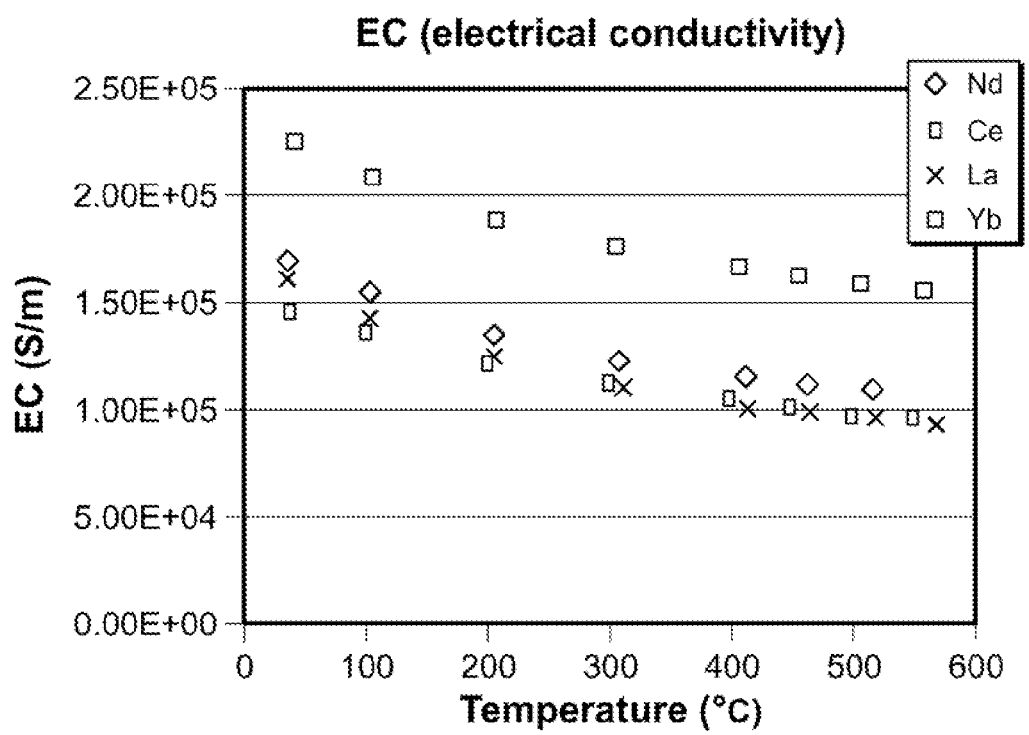
FIG. 13a presents graphed data of the measured electrical conductivity as a function of temperature for hot pressed samples of particles having the stoichiometries $NdFe_{3.5}Co_{0.5}Sb_{12}$, $LaFe_{3.5}Co_{0.5}Sb_{12}$, $YbFe_{3.5}Co_{0.5}Sb_{12}$, and $CeFe_{3.5}Co_{0.5}Sb_{12}$, where samples used particles ball milled for 20 hours, consistent with some embodiments.
Figure 13B:
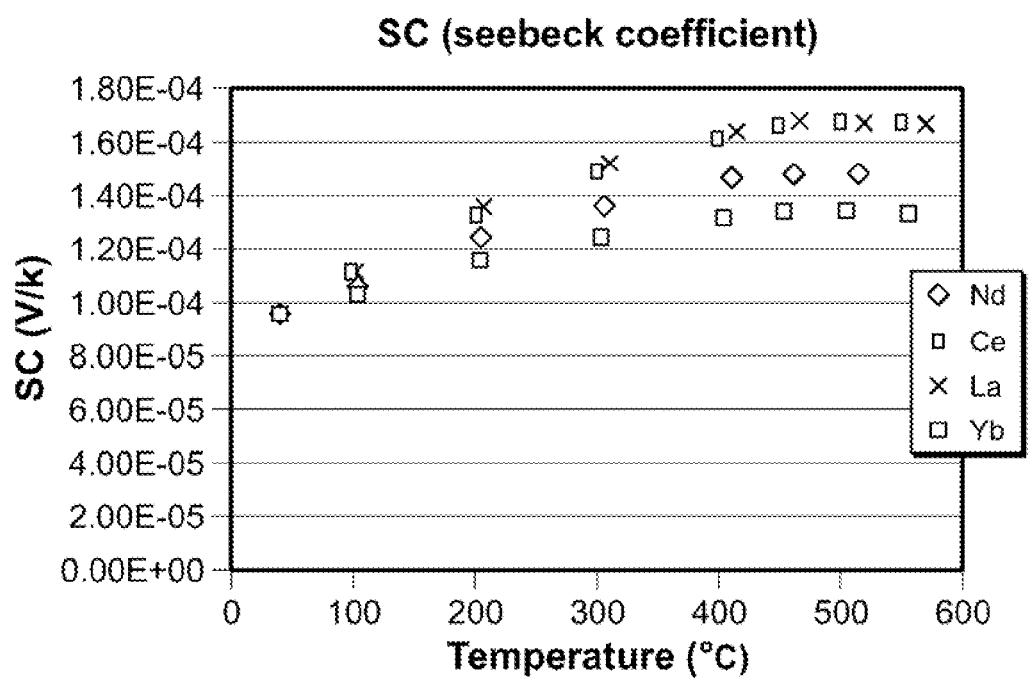
Figure 13C:
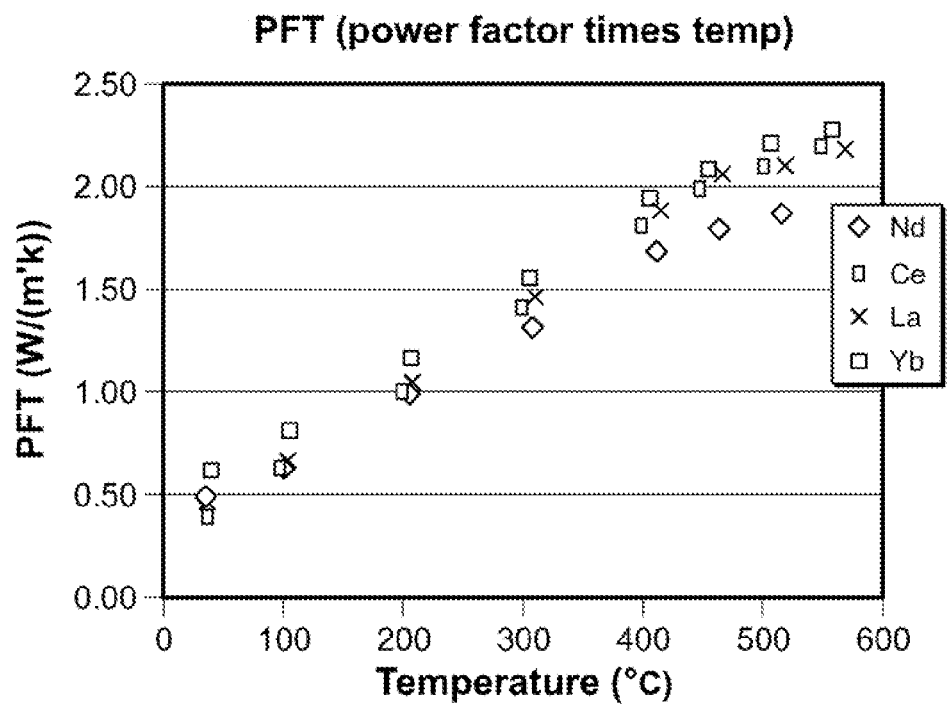
Figure 13D:
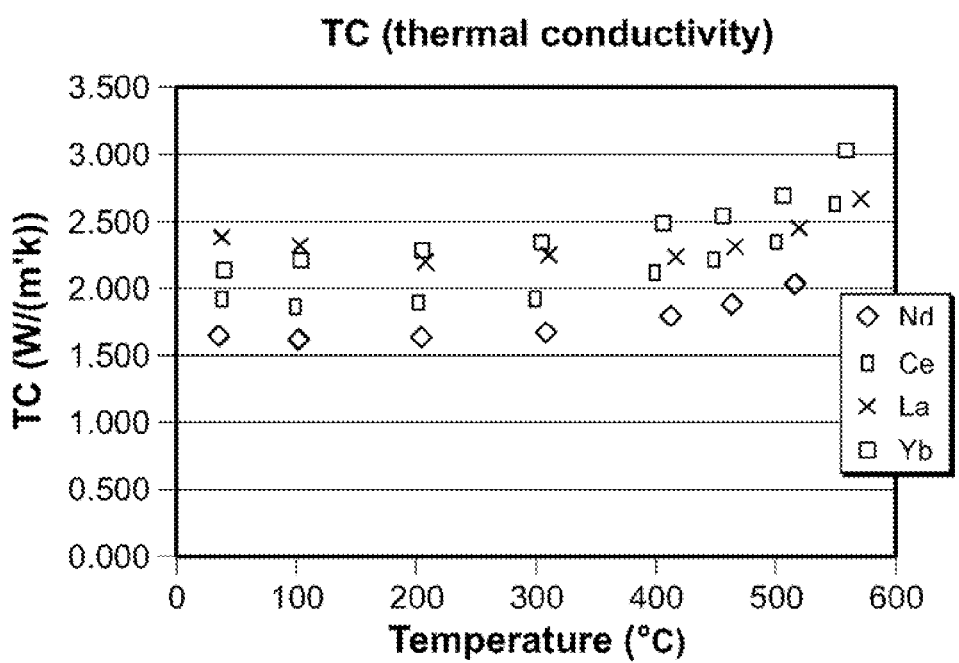
Figure 13E:
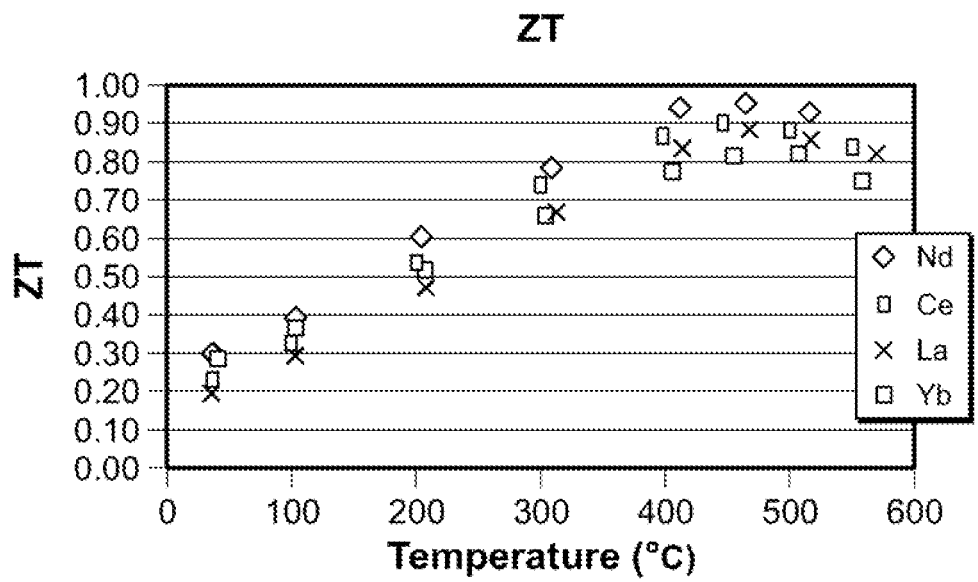

FIGS. 13a-13e present graphs of the thermoelectric properties of four $ReFe_{3.5}Co_{0.5}Sb_{12}$ samples ball-milled for 20 hours, where, for individual samples, Re is one of lanthanum, neodymium, cerium, and ytterbium. FIGS. 13a-13d present graphs of the electrical conductivity, Seebeck coefficient, the product of the power factor and temperature, and thermal conductivity, respectively, as a function of temperature for each of the four types of different filler atom samples. FIG. 13e presents a comparative graph of the ZT value as a function of temperature for the samples. In general, the neodymium doped samples exhibited the best ZT properties of the four tested dopants.

Figure 14A:
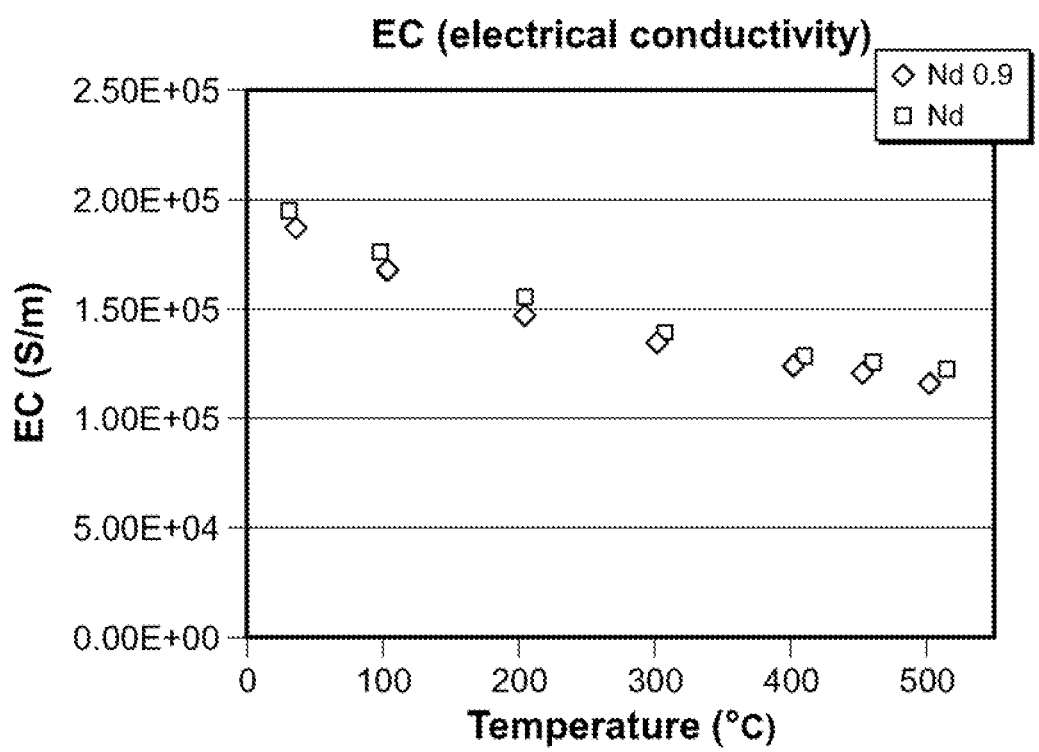
FIG. 14a presents graphed data of the measured electrical conductivity as a function of temperature for hot pressed samples of particles having the stoichiometries $NdFe_{3.5}Co_{0.5}Sb_{12}$ and $Nd_{0.9}Fe_{3.5}Co_{0.5}Sb_{12}$, where samples used particles ball milled for 15 s hours, consistent with some embodiments.
Figure 14B:
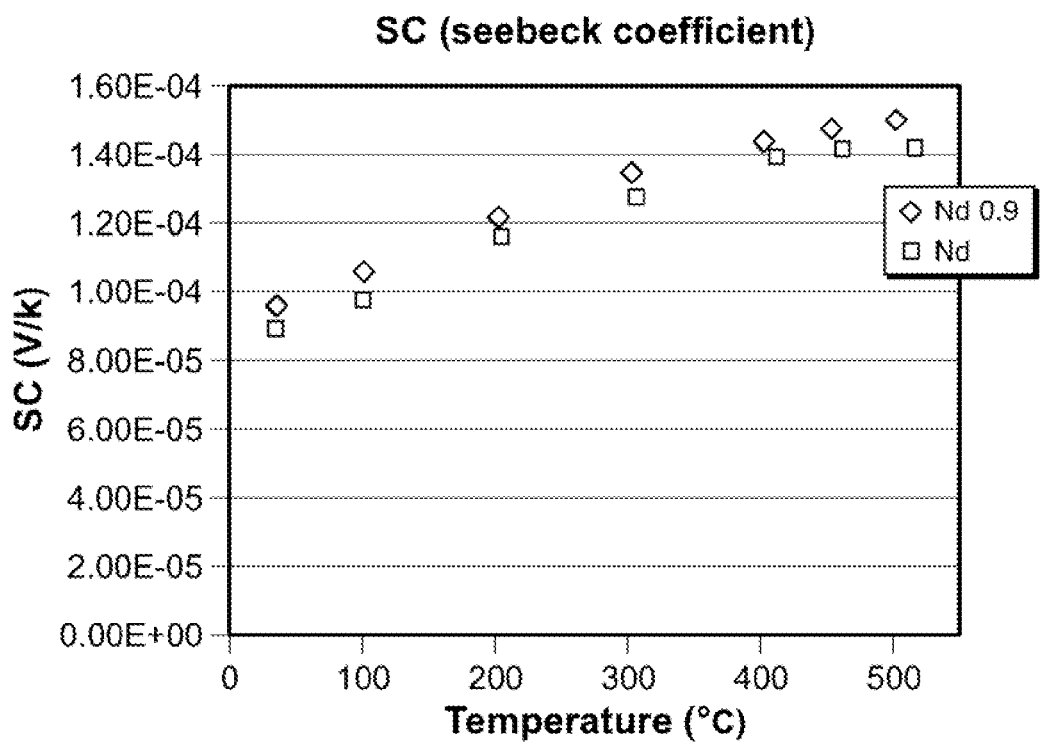
Figure 14C:
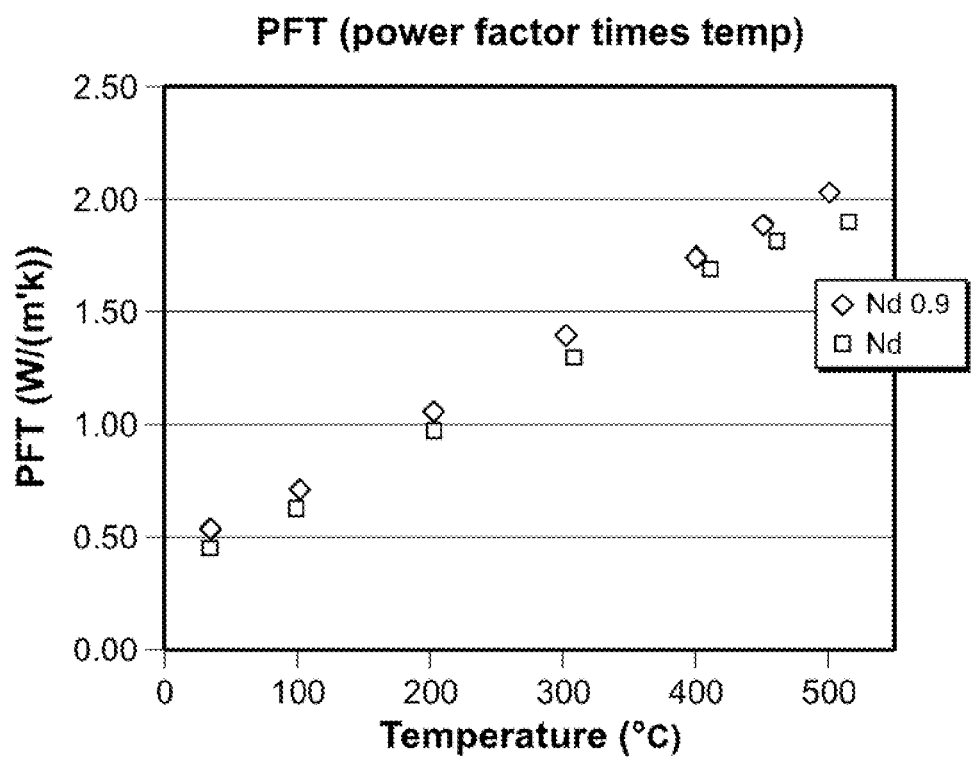
Figure 14D:
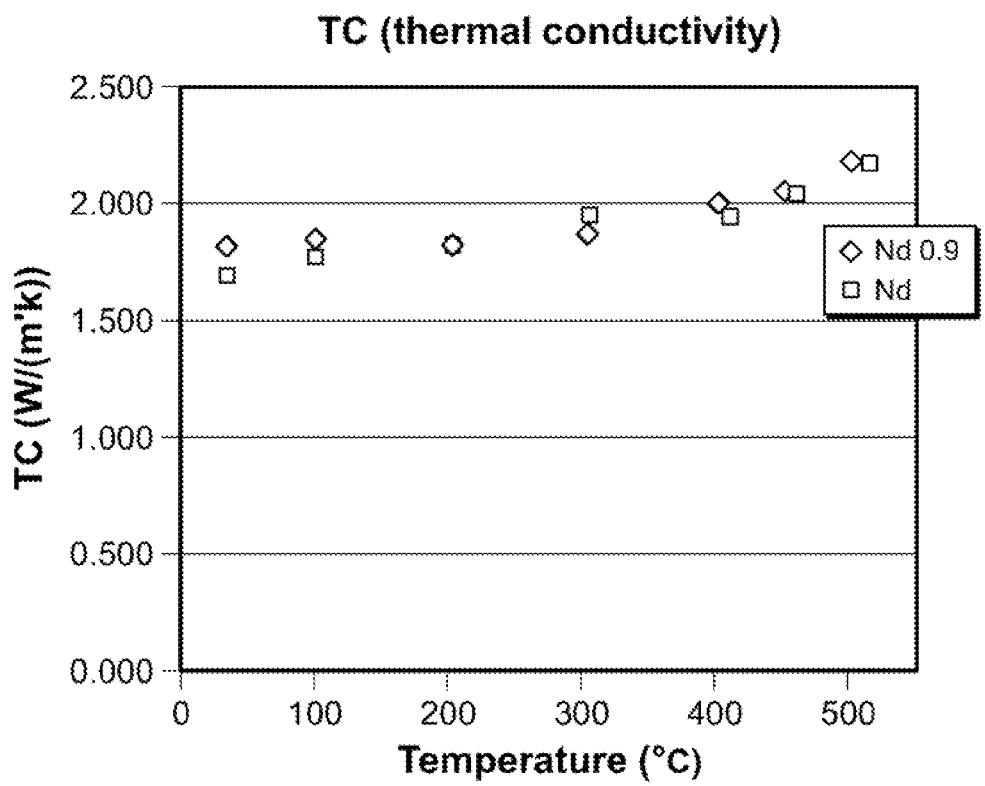
Figure 14E:
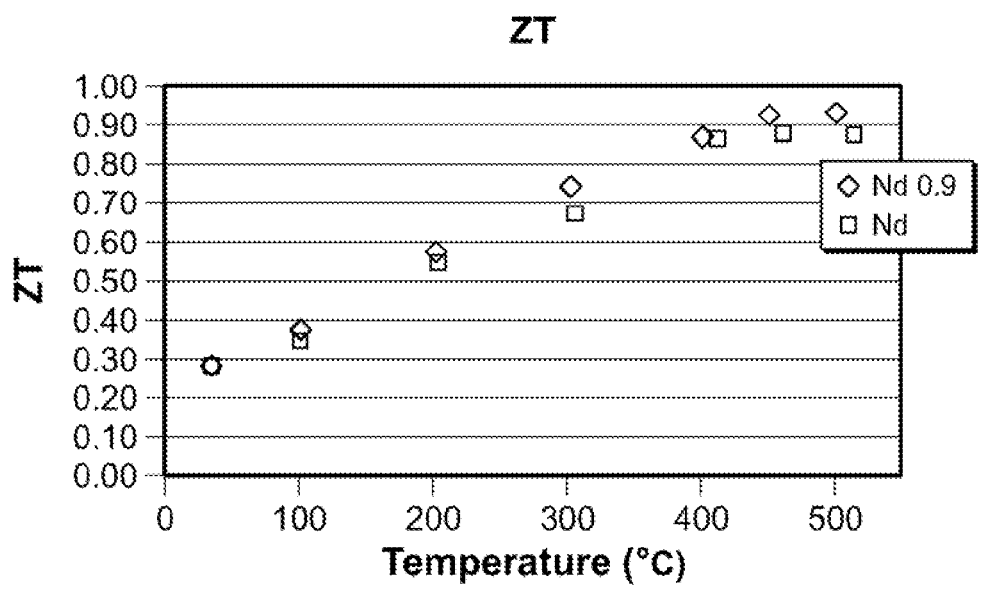

FIGS. 14a-14e present the comparative thermoelectric properties of a $NdFe_{3.5}Co_{0.5}Sb_{12}$ sample and a $Nd_{0.9}Fe_{3.5}Co_{0.5}Sb_{12}$ sample, each ball-milled for 15 hours. FIGS. 14a-14d present graphs of the electrical conductivity, Seebeck coefficient, the product of the power factor and temperature, and thermal conductivity, respectively, as a function of temperature for each of the different neodymium-doped samples. FIG. 14e presents a comparative graph of the ZT value as a function of temperature for the samples. In general, the lower neodymium doped sample exhibited better ZT properties.

Figure 15A:
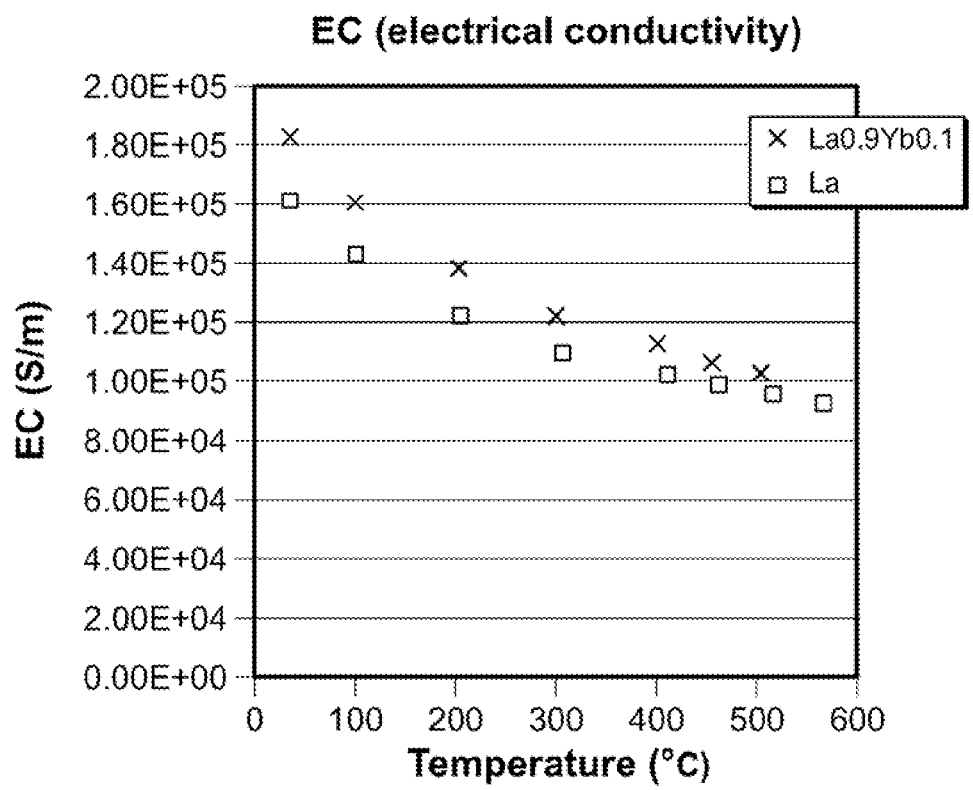
FIG. 15a presents graphed data of the measured electrical conductivity as a function of temperature for hot pressed samples of particles having the stoichiometries $LaFe_{3.5}Co_{0.5}Sb_{12}$ and $La_{0.9}Yb_{0.1}Fe_{3.5}Co_{0.5}Sb_{12}$, where samples used particles ball milled for 15 s hours, consistent with some embodiments.
Figure 15B:
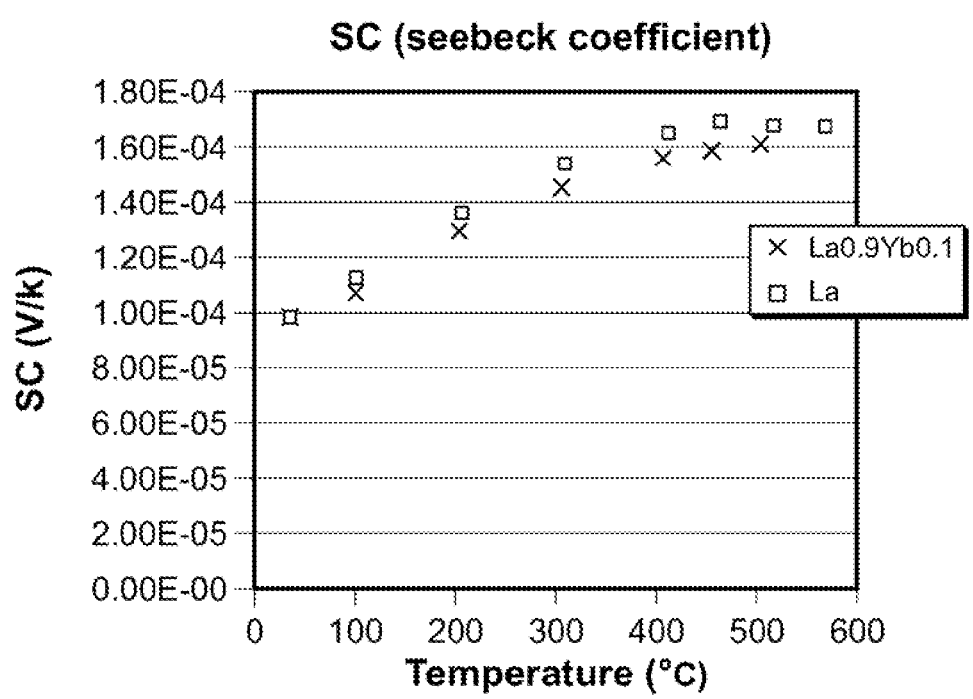
Figure 15C:
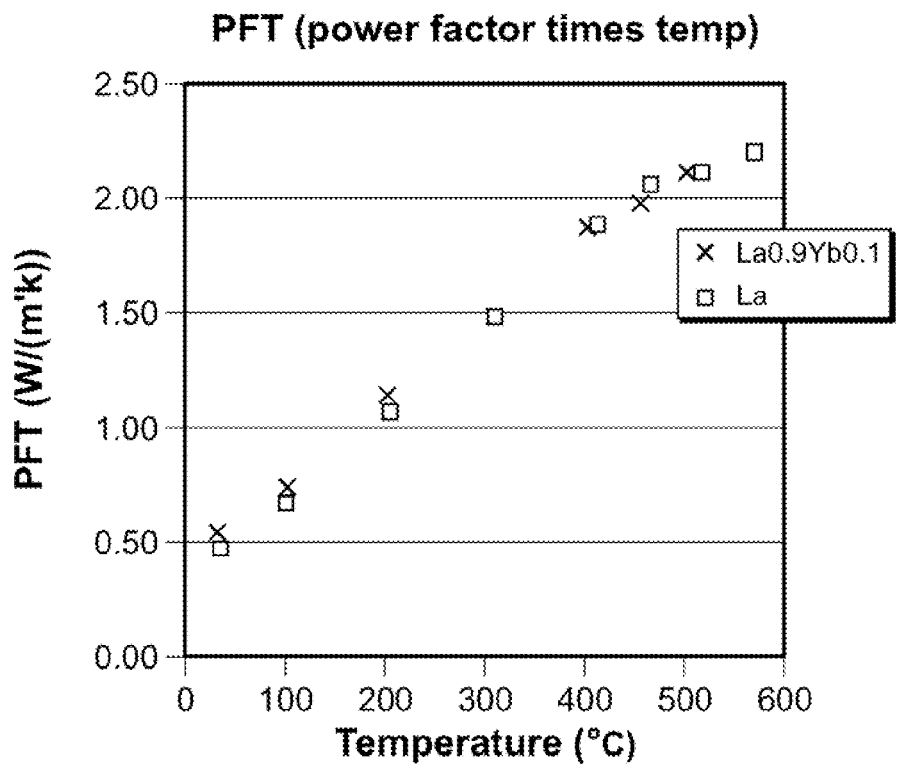
Figure 15D:
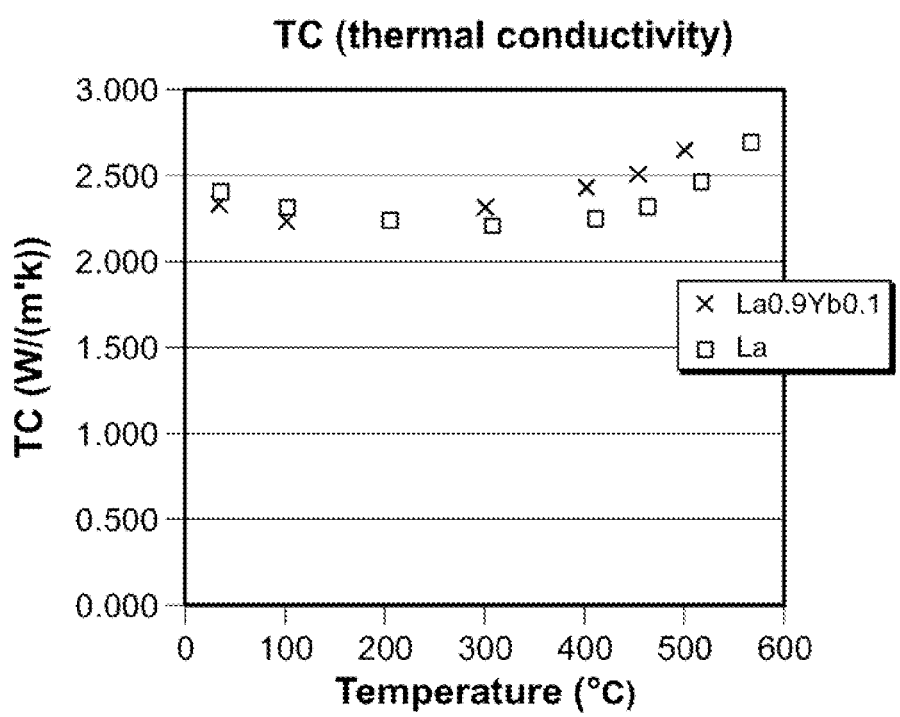
Figure 15E:
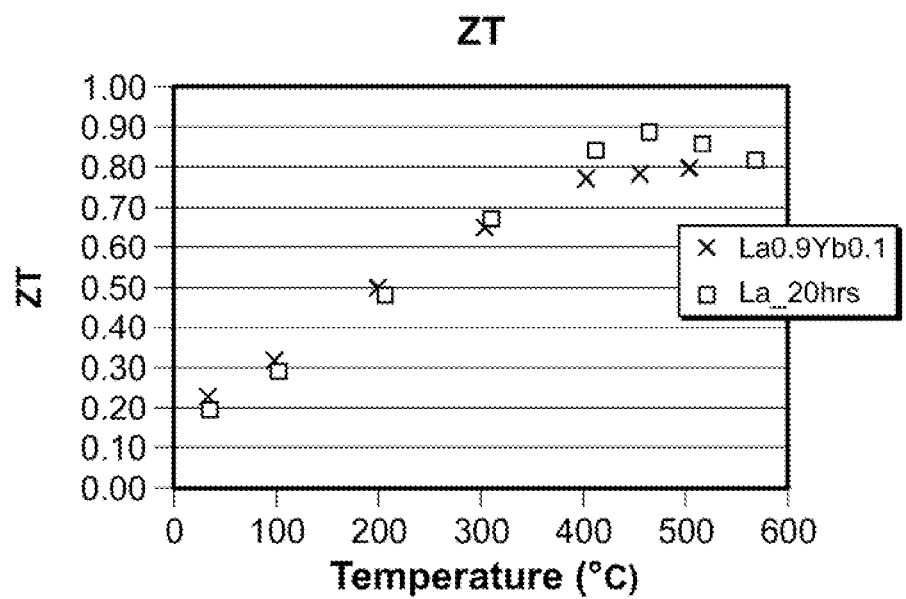

FIGS. 15a-15e present the comparative thermoelectric properties of a $LaFe_{3.5}Co_{0.5}Sb_{12}$ sample and a $La_{0.9}Yb_{0.1}Fe_{3.5}Co_{0.5}Sb_{12}$ sample. FIGS. 15a-15d present graphs of the electrical conductivity, Seebeck coefficient, the product of the power factor and temperature, and thermal conductivity, respectively, as a function of temperature for each of the different lanthanum-doped samples. FIG. 15e presents a comparative graph of the ZT value as a function of temperature for the samples. The sample without ytterbium exhibited better ZT properties.

EQUIVALENTS

While the present invention has been described in terms of specific methods, structures, and compositions, it is understood that variations and modifications will occur to those skilled in the art upon consideration of the present invention. For example, some of the compositions discussed herein can be prepared using techniques beyond the methods discussed in some embodiments. As well, the features illustrated or described in connection with one embodiment can be combined with the features of other embodiments. Such modifications and variations are intended to be included within the scope of the present invention. Those skilled in the art will appreciate, or be able to ascertain using no more than routine experimentation, further features and advantages of the invention based on the above-described embodiments. Accordingly, the invention is not to be limited by what has been particularly shown and described, except as indicated by the appended claims.

All publications and references are herein expressly incorporated by reference in their entirety. The terms "a" and "an" can be used interchangeably, and are equivalent to the phrase "one or more" as utilized in the present application. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

What is claimed is:

1. A method of fabricating an enhanced thermoelectric material comprising:
    providing at least one starting material which comprises at least one skutterudite-based starting material;
    generating a plurality of nanoparticles having an average particle size less than about 500 nm from the at least one skutterudite-based starting material; and
    consolidating the nanoparticles under pressure in a range from about 10 MPa to about 300 MPa at an elevated temperature to form a densified material, the densified material comprising a plurality of grains, each of the plurality of grains exhibiting a skutterudite-based structure, and the densified material exhibits a ZT value greater than about 0.8,
    wherein the densified material exhibits a higher ZT value at least at one temperature relative to at least one of the skutterudite-based starting materials.

2. The method of claim 1, wherein the at least one starting material comprises at least one element of the skutterudite-based structure of each of the plurality of grains.

3. The method of claim 2, wherein the at least one starting material comprises filler atoms in the skutterudite-based structure.

4. The method of claim 2, wherein the skutterudite-based structure lacks filler atoms.

5. The method of claim 1, wherein the at least one skutterudite-based starting material comprises at least two different skutterudite-based starting materials.

6. The method of claim 5, wherein the step of generating comprises grinding the at least two different skutterudite-based starting materials separately or simultaneously.

7. The method of claim 1, wherein the step of generating the plurality of nanoparticles includes grinding the at least one starting material.

8. The method of claim 7, further comprising:
    cooling the at least one starting material while performing the step of grinding.

9. The method of claim 7, wherein the step of grinding the at least one starting material comprises utilizing ball milling.

10. The method of claim 1, wherein the step of consolidating the nanoparticles includes using a hot press process.

11. The method of claim 10, wherein the step of using a hot press process including using at least one of direct current induced hot press, unidirectional hot press, plasma pressure compaction, and isostatic hot press.

12. The method of claim 1, further comprising:
    selecting the pressure to be in a range from about 10 MPa to about 100 MPa.

13. The method of claim 1, further comprising:
    selecting the elevated temperature to be in a range from about 200° C. to about 800° C.

14. The method of claim 1, further comprising maintaining the nanoparticles at the elevated temperature for a time period between about 1 sec and about 10 hours.

15. The method of claim 1, wherein the plurality of nanoparticles exhibit an average particle size smaller than about 50 nm.

16. The method of claim 1, wherein the plurality of grains in the densified material exhibit an average grain size smaller than about 5 μm.

17. The method of claim 1, wherein the skutterudite-based structure comprises a crystal having metal atoms forming a cubic sublattice.

18. The method of claim 17, wherein the metal atoms comprise at least two of cobalt, iron, nickel, rhodium, iridium, ruthenium, and osmium.

19. The method of claim 1, wherein the skutterudite-based structure comprises a filler-containing skutterudite material.

20. The method of claim 1, wherein the densified material exhibits the higher ZT value at a temperature below about 800° C.

21. The method of claim 1, wherein an average grain size of the densified material is larger than an average size of the nanoparticles.

* * * * *